（12) United States Patent
Choi et al.

(10) Patent No.: US 12,271,223 B2
(45) Date of Patent: Apr. 8, 2025

(54) ELECTRONIC DEVICE FOR CALIBRATING ILLUMINANCE SENSOR

(71) Applicant: SAMSUNG ELECTRONICS CO., LTD., Suwon-si (KR)

(72) Inventors: Gwangho Choi, Suwon-si (KR); Jongah Kim, Suwon-si (KR); Heewoong Yoon, Suwon-si (KR); Kihyuk Lee, Suwon-si (KR); Donghan Lee, Suwon-si (KR); Jeongho Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 204 days.

(21) Appl. No.: 18/124,144

(22) Filed: Mar. 21, 2023

(65) Prior Publication Data

US 2023/0221760 A1 Jul. 13, 2023

Related U.S. Application Data

(63) Continuation of application No. PCT/KR2021/005500, filed on Apr. 30, 2021.

(30) Foreign Application Priority Data

Sep. 21, 2020 (KR) .......................... 10-2020-0121562

(51) Int. Cl.
*G06F 1/16* (2006.01)
*G01D 11/24* (2006.01)
(Continued)

(52) U.S. Cl.
CPC ........... *G06F 1/1616* (2013.01); *G01D 11/24* (2013.01); *G06F 1/1677* (2013.01); *G09G 3/035* (2020.08);
(Continued)

(58) Field of Classification Search
CPC .... H04M 1/72454; H04M 1/725; H04M 1/02; H01L 31/125; H01L 31/143;
(Continued)

(56) References Cited

U.S. PATENT DOCUMENTS 9,129,548 B2 9/2015 Zheng
10,145,733 B2 12/2018 Mazuelas et al.
(Continued)

FOREIGN PATENT DOCUMENTS

CN 109887453 A 6/2019
JP 2002-075664 A 3/2002
(Continued)

OTHER PUBLICATIONS

Communication dated Aug. 6, 2021, issued by the International Searching Authority in counterpart International Application No. PCT/KR2021/005500 (PCT/ISA/210).
(Continued)

*Primary Examiner* — Doon Y Chow
(74) *Attorney, Agent, or Firm* — Sughrue Mion, PLLC

(57) ABSTRACT

A portable electronic device includes a foldable housing; a display; an illuminance sensor; a state detection sensor; a memory; and a processor. Based on data received from the state detection sensor, the portable electronic device is recognized to be in the folded state. Responsive to the portable electronic device being in a calibration trigger state which includes the folded state, a first image is displayed in a sensor area of a first display area located on the illuminance sensor, and a second image is displayed in an area of the second display area facing the sensor area. An illuminance value is calculated based on data received from the illuminance sensor while the first image and the second image are displayed, and then compared to a reference value stored in the memory to calculate a calibration value for
(Continued)

calibrating measured illuminance values of the illuminance sensor.

15 Claims, 16 Drawing Sheets

(51) Int. Cl.
  *G09G 3/00* (2006.01)
  *H01L 31/12* (2006.01)
  *H01L 31/14* (2006.01)
(52) U.S. Cl.
  CPC .......... *H01L 31/125* (2013.01); *H01L 31/143* (2013.01); *G09G 2320/0693* (2013.01); *G09G 2360/144* (2013.01); *G09G 2360/16* (2013.01)
(58) Field of Classification Search
  CPC .. H01L 31/165; G09G 3/035; G09G 2360/16; G09G 2360/144; G09G 2320/0693; G06F 1/1677; G06F 1/1616; G06F 1/1652; G01D 11/24
  See application file for complete search history.

(56) References Cited

U.S. PATENT DOCUMENTS

| | | | | |
|---|---|---|---|---|
| 10,648,862 | B2* | 5/2020 | Sarkar | G01J 1/44 |
| 2010/0163717 | A1* | 7/2010 | Chang | G01D 18/008 |
| | | | | 250/252.1 |
| 2014/0132578 | A1* | 5/2014 | Zheng | G01J 1/4228 |
| | | | | 345/207 |
| 2014/0375219 | A1 | 12/2014 | Lee et al. | |
| 2016/0370231 | A1* | 12/2016 | Agahian | G09G 3/2003 |
| 2017/0053604 | A1 | 2/2017 | Li et al. | |
| 2017/0309226 | A1 | 10/2017 | In et al. | |
| 2020/0152724 | A1 | 5/2020 | Cho et al. | |
| 2020/0265799 | A1 | 8/2020 | Choi et al. | |
| 2020/0320962 | A1* | 10/2020 | Kim | G09G 5/14 |
| 2021/0056877 | A1* | 2/2021 | Chew | F16M 11/2021 |
| 2021/0241718 | A1* | 8/2021 | Tsubokura | G09G 5/10 |
| 2024/0370128 | A1* | 11/2024 | Wong | G06F 3/0481 |

FOREIGN PATENT DOCUMENTS

| | | |
|---|---|---|
| JP | 2013-007827 A | 1/2013 |
| JP | 5459293 B2 | 4/2014 |
| KR | 10-1041640 B1 | 6/2011 |
| KR | 10-2016-0132465 A | 11/2016 |
| KR | 10-2017-0122313 A | 11/2017 |
| KR | 10-2019-0026128 A | 3/2019 |
| KR | 10-2081931 B1 | 2/2020 |
| KR | 10-2020-0101263 A | 8/2020 |

OTHER PUBLICATIONS

Communication dated Aug. 6, 2021, issued by the International Searching Authority in counterpart International Application No. PCT/KR2021/005500 (PCT/ISA/237).

* cited by examiner

ELECTRONIC DEVICE FOR CALIBRATING ILLUMINANCE SENSOR

CROSS-REFERENCE TO RELATED APPLICATIONS

This application is a continuation application of International Application No. PCT/KR2021/005500, filed on Apr. 30, 2021, which is based on and claims priority to Korean Patent Application No. 10-2020-0121562, filed on Sep. 21, 2020 in the Korean Intellectual Property Office, the disclosures of each of which are incorporated by reference herein in their entireties.

BACKGROUND

1. Field

The present disclosure relates to an electronic device configured to calibrate an illuminance sensor used to control brightness of a screen.

2. Description of Related Art

In the related art, an electronic device may include a display and an illuminance sensor disposed under a specified area (e.g., a region of interest (ROI) or a sensor area) of the display to measure external illuminance. The electronic device may adjust the brightness of the display, based on the measured illuminance. For example, the electronic device may configure a screen of the display to be dark in a dark environment with a low external illuminance and configure the screen to be bright in a bright environment with a relatively high external illuminance, thereby increasing visibility.

Even with the same external environment (e.g., the same ambient brightness of the electronic device), a measured illuminance value may vary between illuminance sensors due to the difference in performance between the respective illuminance sensors, the difference in the degree of deterioration between the respective illuminance sensors, the assembly tolerance for each device (e.g., a smartphone) equipped with the illuminance sensor, and the difference in transmittance between the displays placed over the illuminance sensors.

The operation of controlling the screen brightness may therefore be different between devices due to differences in an illuminance value measured by each illuminance sensor. For example, even under the same brightness condition, the screen brightness of a display configured in a first electronic device and the screen brightness of a display configured in a second electronic device may differ due to differences in the respective measured illuminance values.

SUMMARY

Provided is an electronic device which calibrates an illuminance sensor, and more specifically the illuminance value measurements of the sensor, such that the same screen brightness is to be provided in the same external environment. Technical problems solved by embodiments of the disclosure are not limited to the above-mentioned technical problem, and other technical problems not mentioned may be clearly understood by those skilled in the art from the description below.

A portable electronic device according to various embodiments may include a foldable housing including a first housing and a second housing coupled to the first housing so as to be rotatable relative to the first housing, a display including a first display area disposed in a space formed inside the first housing and a second display area disposed in a space formed inside the second housing, the second display area facing the first display area when the portable electronic device is in a folded state, a first illuminance sensor disposed under the first display area and having a field of view facing the first display area, a state detection sensor configured to detect a state of the foldable housing, a memory, and a processor connected to the display, the first illuminance sensor, the state detection sensor, and the memory. The processor may be configured to store a reference value used for calibration of the illuminance sensor in the memory, recognize that the portable electronic device is in the folded state based on data received from the state detection sensor, display a first image in a sensor area of the first display area positioned above the first illuminance sensor and display a second image in an area of the second display area facing the sensor area responsive to the portable electronic device being in a calibration trigger state including the folded state, calculate an illuminance value based on data received from the first illuminance sensor while the first image and the second image are being displayed, calculate a calibration value for calibrating measured illuminance values of the first illuminance sensor, based on a comparison of the calculated illuminance value with the reference value stored in the memory, and store the calibration value in the memory.

According to various embodiments, it is possible to provide an electronic device capable of configuring screen brightness using a calibrated illuminance value. In addition to this, various effects identified directly or indirectly through the disclosed embodiments may be provided.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
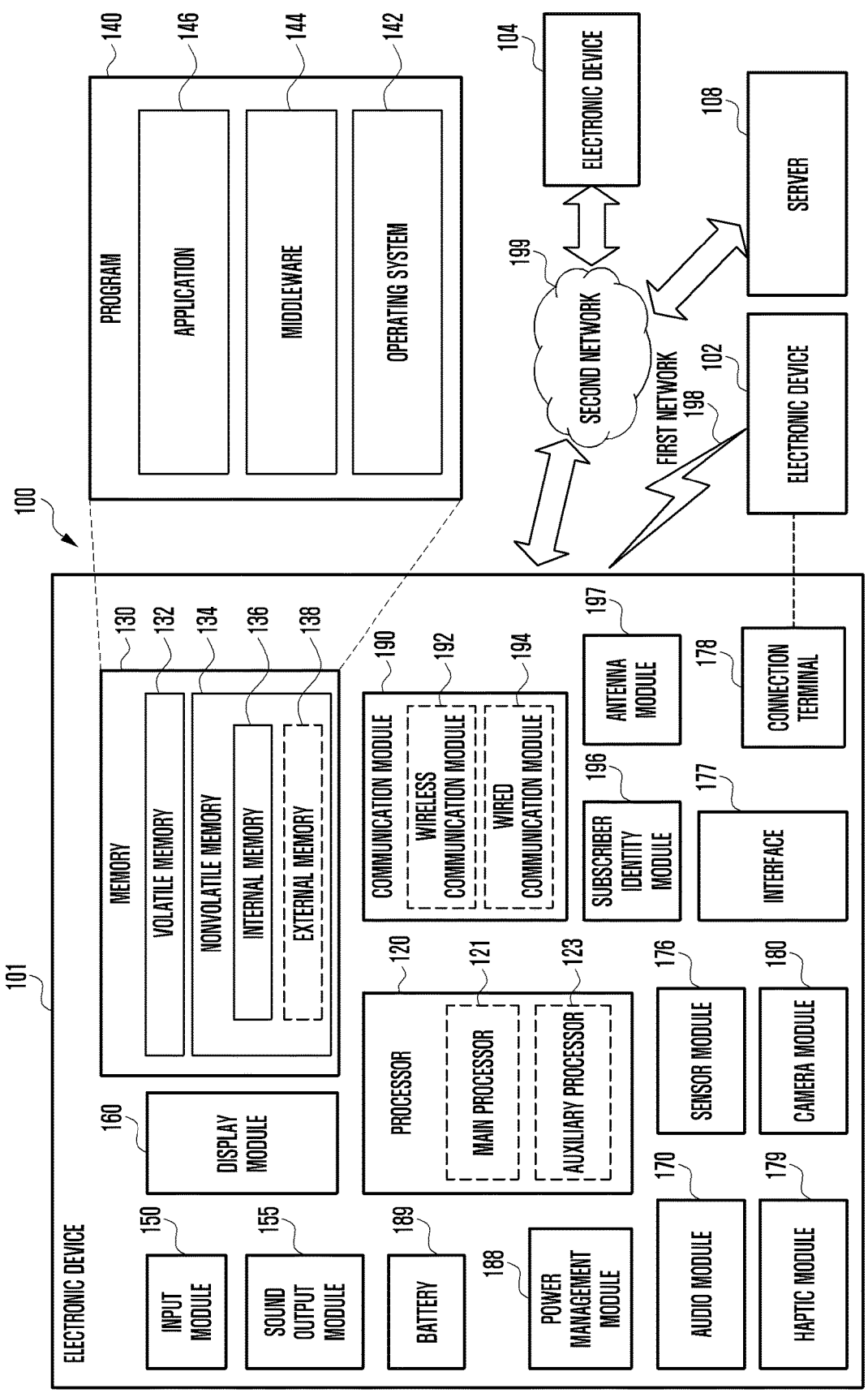
FIG. 1 is a block diagram illustrating an electronic device in a network environment, according to various embodiments.

FIG. 1 is a block diagram illustrating an electronic device 101 in a network environment 100, according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
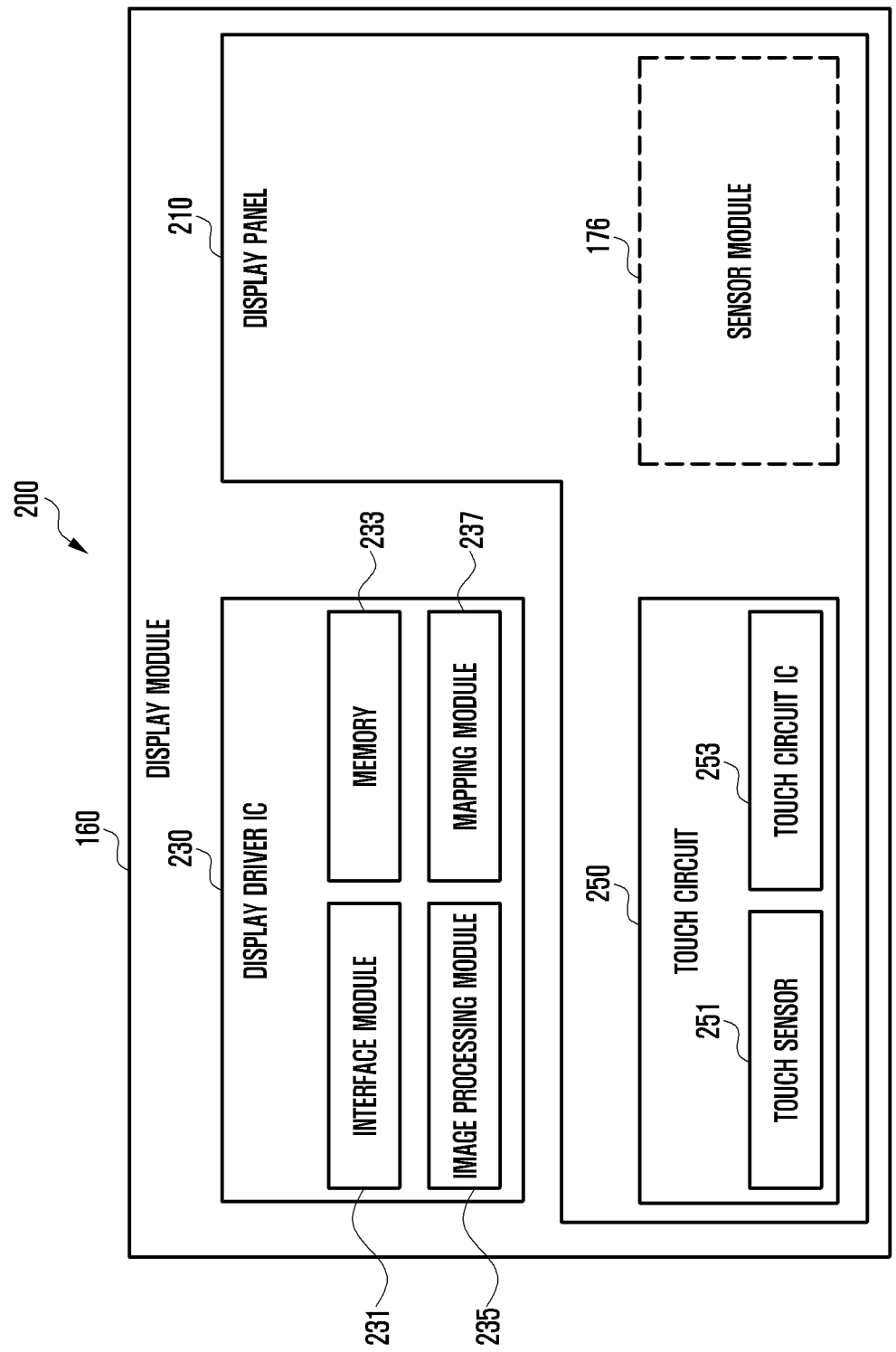
FIG. 2 is a block diagram illustrating a display module, according to various embodiments.

FIG. 2 is a block diagram 200 illustrating the display module 160, according to various embodiments. Referring to FIG. 2, the display module 160 may include a display 210 (such as a display panel) and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 176 via the interface module 231. The DDI 230 may also store at least part of the received image information in the memory 233, for example, on a frame by frame basis. The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210. The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display module 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display module 160.

According to an embodiment, the display module 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display module 160. For example, when the sensor module 176 embedded in the display module 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display module 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments, a portable electronic device (e.g., the electronic device 101 in FIG. 1) may have a foldable housing divided into two housings around a folding axis. A first portion (e.g., a first display area) of a display (e.g., a flexible display) may be disposed in a first housing, and a second portion (e.g., a second display area) of the display may be disposed in a second housing. The foldable housing may be implemented by an in-folding type in which the first portion and the second portion face each other when the portable electronic device is in a folded state. Alternatively, the foldable housing may be implemented by an out-folding type in which the first portion and the second portion face opposite to each other when the portable electronic device is in the folded state. The surface on which the first portion and second portion of the display are disposed may be defined as a front surface of the portable electronic device, the opposite surface thereof may be defined as a rear surface of the portable electronic device, and the surface surrounding the space between the front surface and the rear surface may be defined as a side surface of the portable electronic device.

Figure 3A:
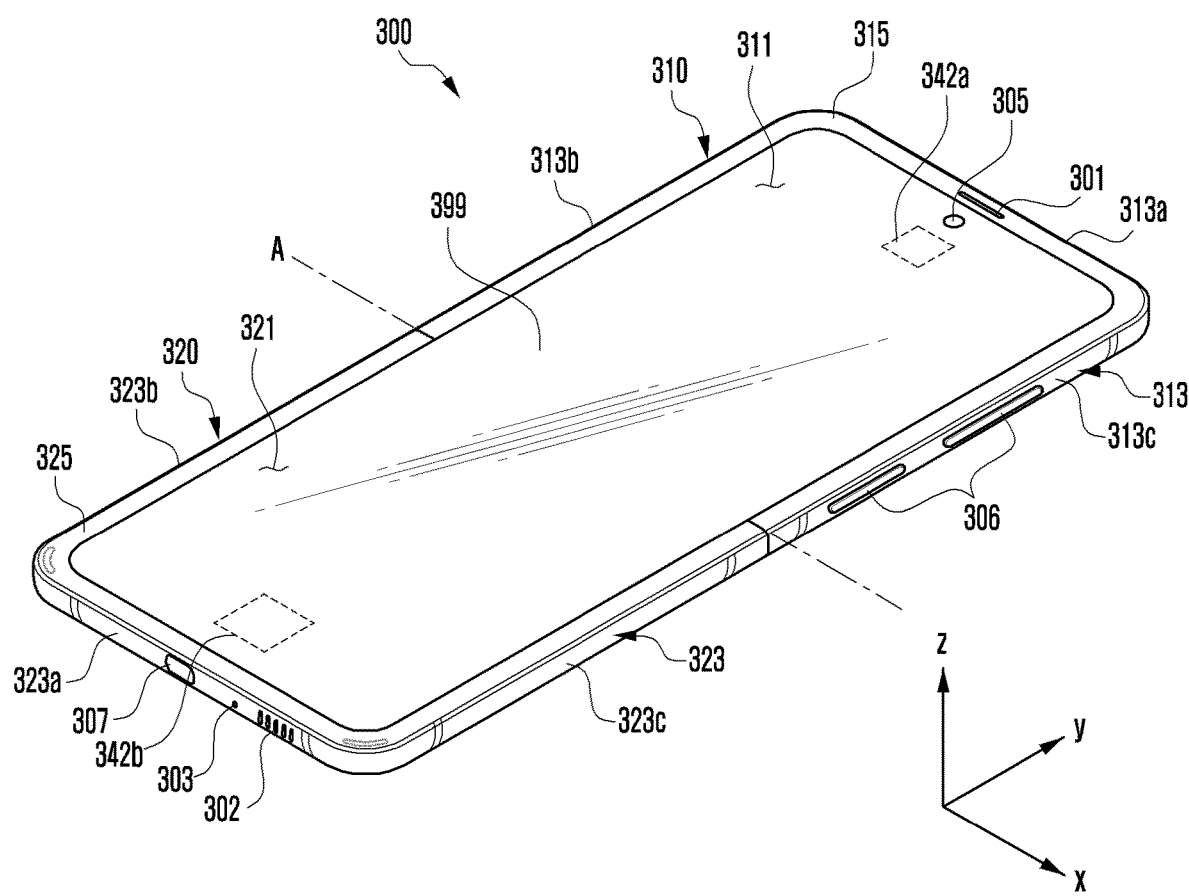
FIGS. 3A to 3F illustrate various views of a portable electronic device having an in-folding type housing structure, according to an embodiment.
Figure 3B:
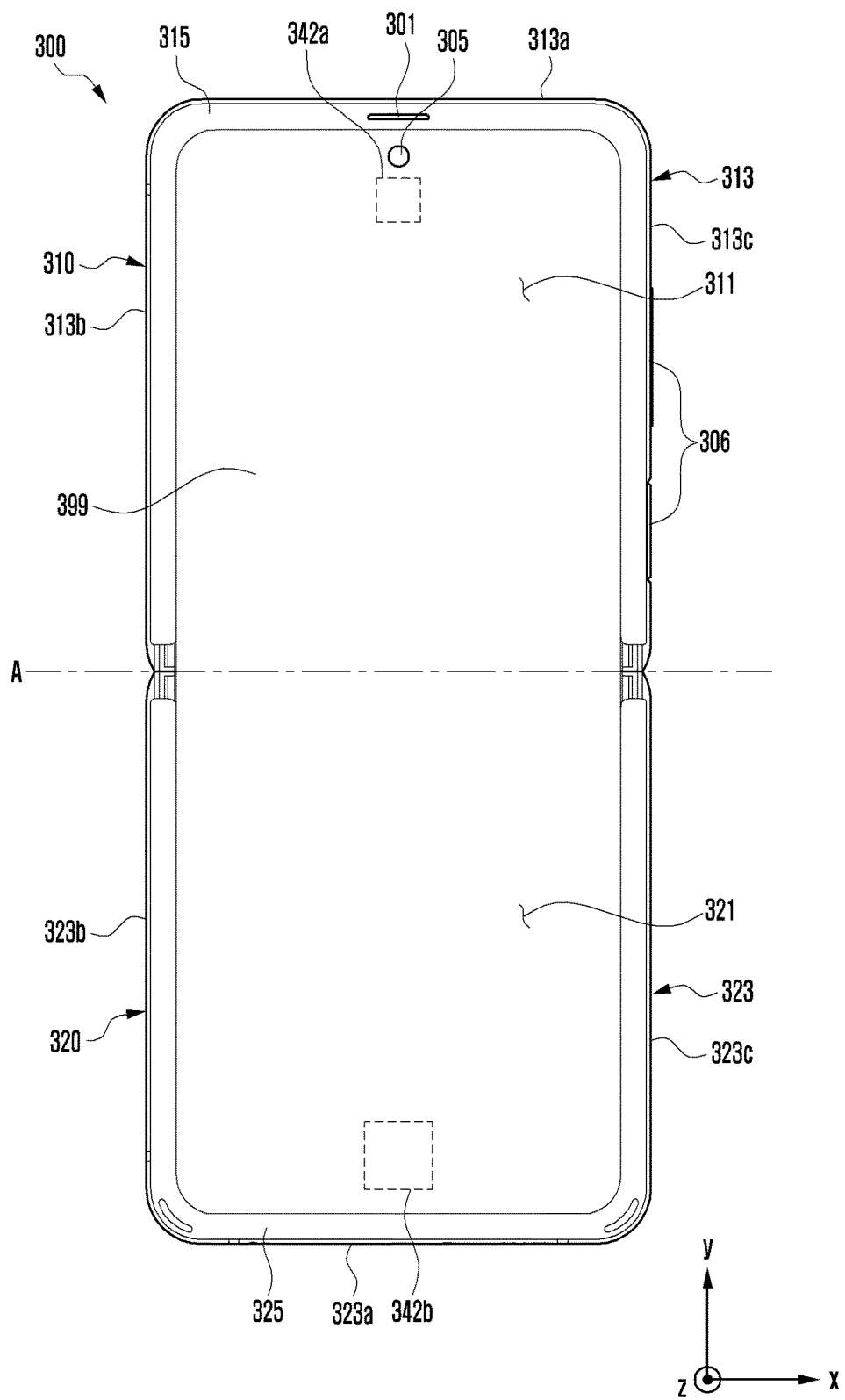
Figure 3C:
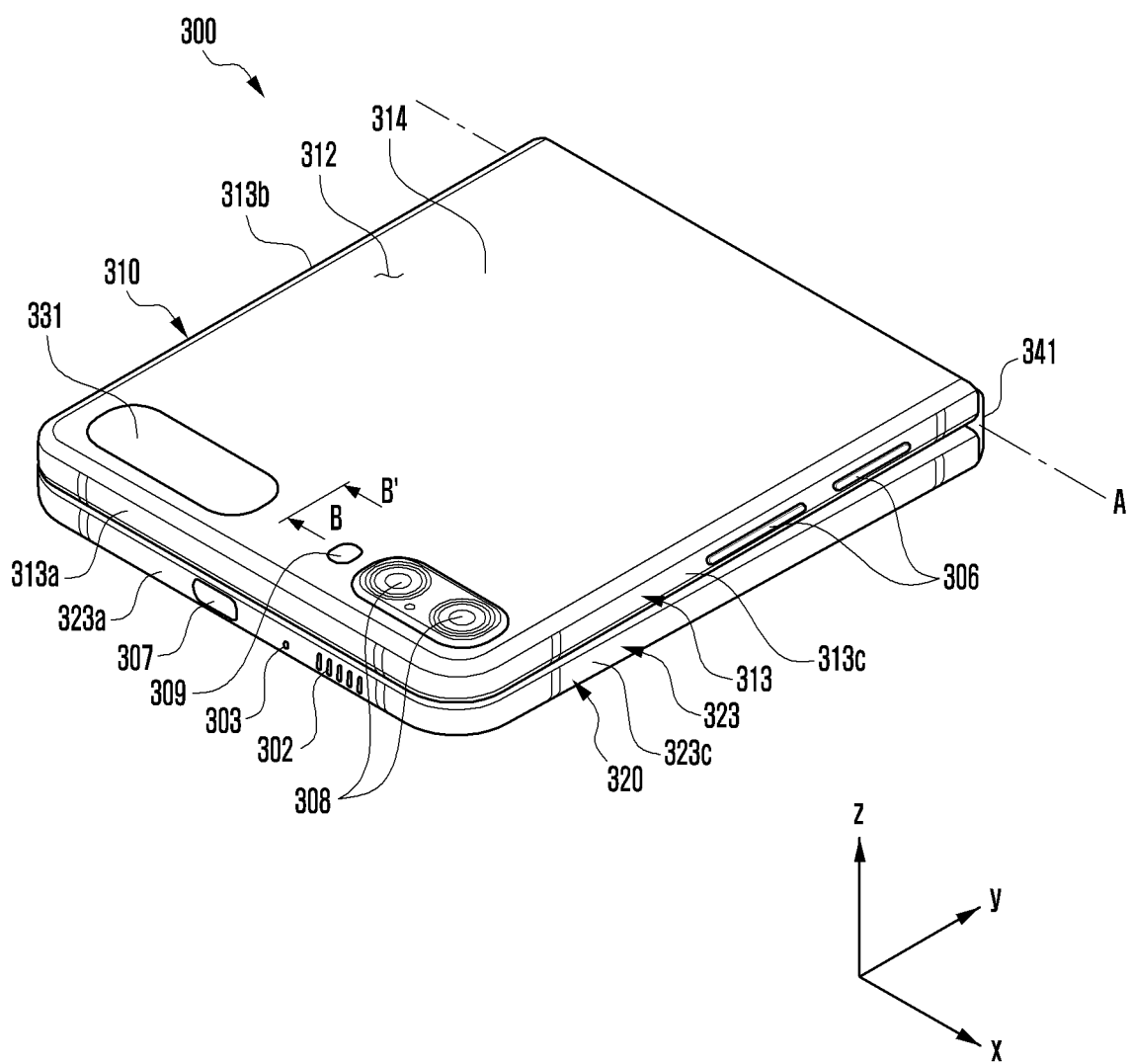
Figure 3D:
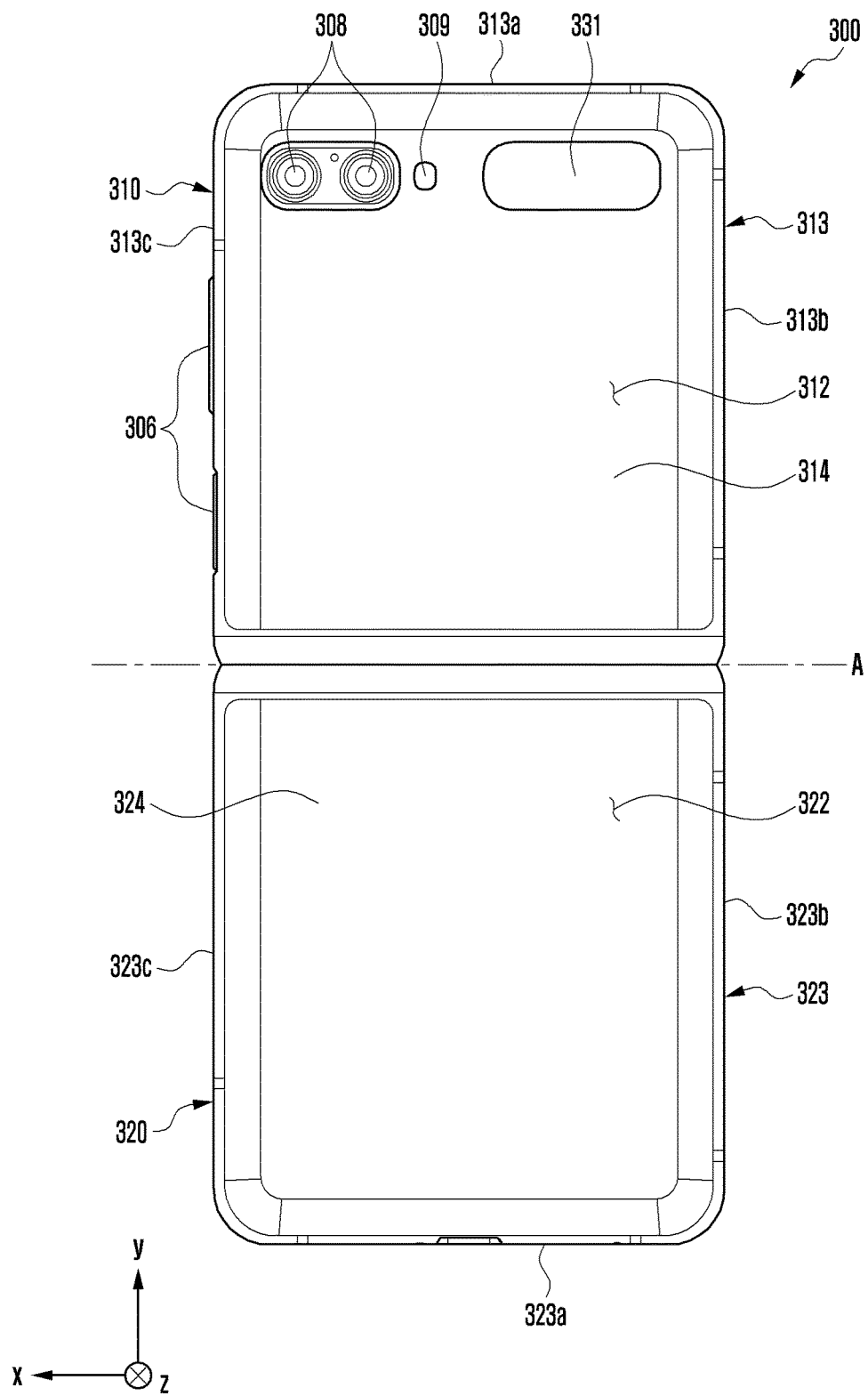
Figure 3E:
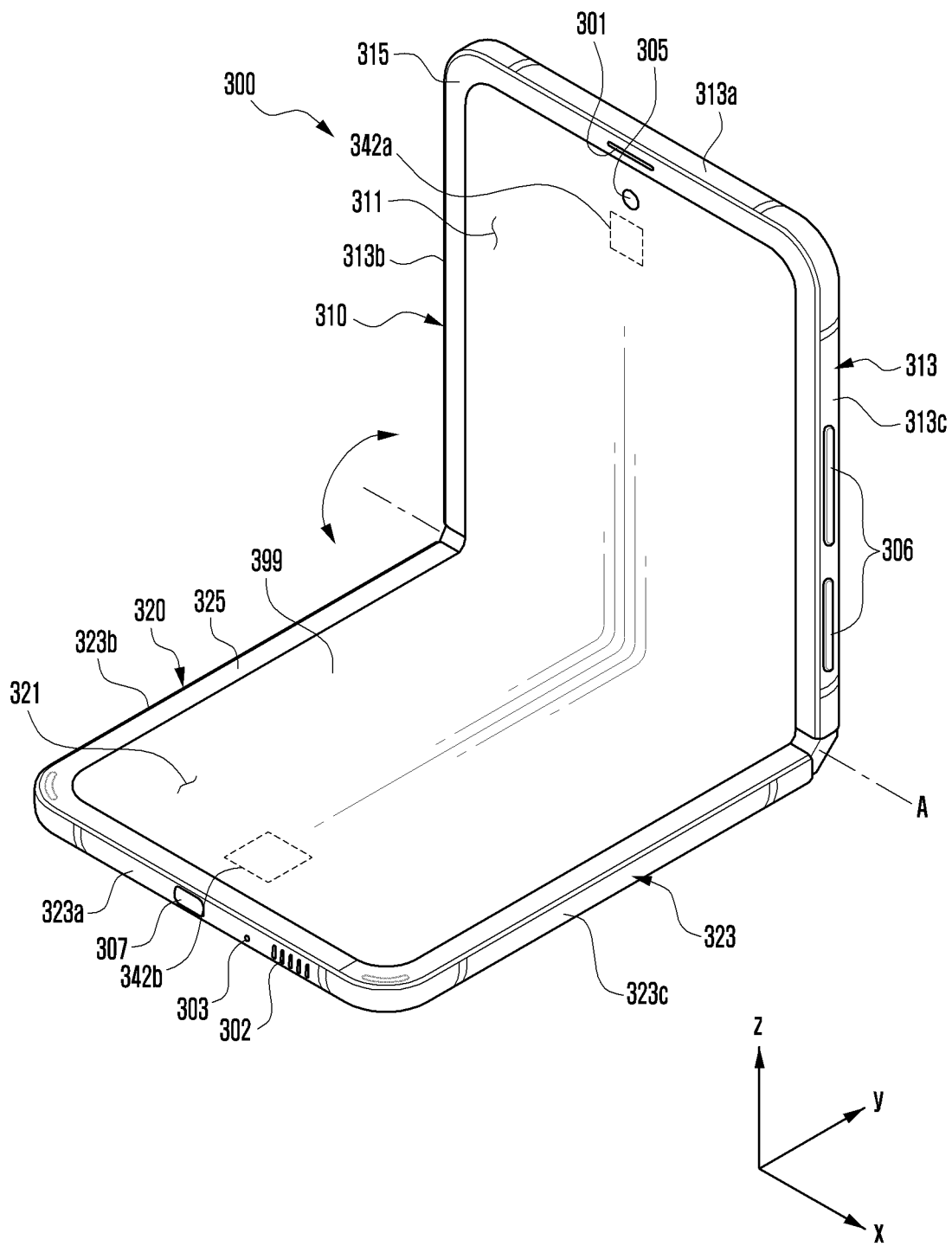
Figure 3F:
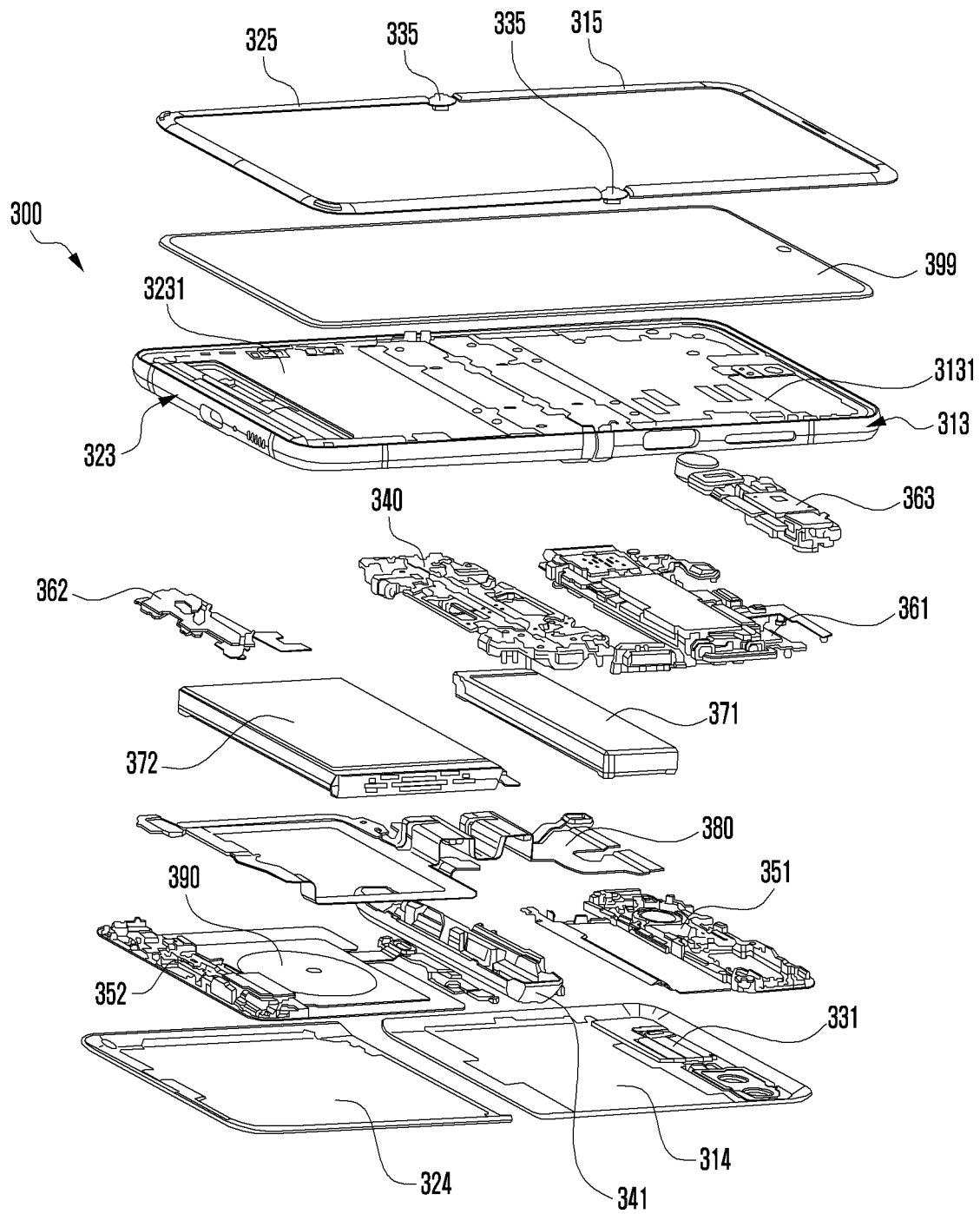

FIG. 3A to 3F illustrate various views of a portable electronic device 300 having an in-folding type housing structure, according to an embodiment. Specifically, FIGS. 3A and 3B illustrate the front surface of a foldable portable electronic device (hereinafter, simply an electronic device) according to various embodiments in an unfolded (flat or open) state, FIG. 3C illustrates the rear surface thereof when the electronic device in a folded (or closed) state, FIG. 3D illustrates the rear surface in an unfolded state, FIG. 3E illustrates the front surface in a partially folded state (in other words, a partially unfolded state or an intermediate state between a fully folded state and a fully unfolded state), and FIG. 3F is an exploded perspective view of the electronic device 300.

Referring to FIGS. 3A to 3F, a portable electronic device 300 (e.g., the electronic device 101 in FIG. 1) may include a first housing 310, a second housing 320, a hinge assembly 340 connecting the first housing 310 and the second housing 320 such that the second housing 320 is rotatable relative to the first housing 310, a flexible or foldable display 399 disposed in a space formed by the foldable housing 310 and 320, and a sensor module (e.g., the sensor module 176 in FIG. 1).

The display 399 may be disposed from the first housing 310 to the second housing 320 across the hinge assembly 340. The display 399 may be divided into a first display area 311 disposed in the inner space of the first housing 310 and a second display area 321 disposed in the inner space of the second housing 320, based on the folding axis A. The hinge assembly 340 may be implemented by an in-folding type such that two display areas 311 and 321 face each other when the portable electronic device 300 switches from the an unfolded state (e.g., the state in FIG. 3A) to a folded state (e.g., the state in FIG. 3C). For example, when the electronic device 300 is the unfolded state, two display areas 311 and 321 may face in substantially the same direction. As the state switches from the unfolded state to the folded state, two display areas 311 and 321 may rotate in a direction in which they face each other. A sensor module (e.g., an illuminance sensor) may be disposed under a sensor area (or light transmission area) 342a of the first display area 311 when viewing the front surface. The position and/or size of the sensor area 342a in the first display area 311 may be determined by the position and/or size of an illuminance sensor disposed under the same. For example, the size (e.g., diameter) of the sensor area 342a may be determined based on the field of view (FOV) (or observation area) of the illuminance sensor. In an embodiment, the sensor area 342a may be configured to have a lower pixel density and/or lower wire density than surrounding areas thereof in order to improve light transmittance. At least a portion of the second display area 321 facing the sensor area 342a when the electronic device 300 is in the folded state may be defined as a facing (face-to-face) area 342b, and the position and/or size of the facing area 342b may be determined based on the position and/or size of the sensor area 342a to be aligned with the facing area 342b in the folded state.

The state of the electronic device 300 may be defined based on an angle formed between two display areas 311 and 321. For example, the state of the electronic device 300 may be defined as an unfolded (flat or open) state when the angle between two display areas 311 and 321 is about 180 degrees. When the angle between two display areas 311 and 321 is between about 0 and 10 degrees, the state of the electronic device 300 may be defined as a folded (or closed) state. When two display areas 311 and 321 form an angle (e.g., between about 10 degrees and 179 degrees) greater than the angle in the folded state and less than the angle in the unfolded state, the state of the electronic device 300 may be defined as an intermediate state (in other words, a partially folded or partially unfolded state) as shown in FIG. 3E.

Based on the state of the electronic device 300, an active area in which visual information (e.g., text, images, or icons) is to be displayed may be determined in the display 399. For example, when the electronic device 300 is in the intermediate state, the active area may be determined as the first display area 311 or the second display area 321. An area with less movement among the first display area 311 and the second display area 321 may be determined as an active area. For example, if a user holds one housing of the electronic device 300 with one hand and opens the other housing with the other hand, the electronic device 300 may switch from the folded state to the intermediate state, and accordingly, the electronic device 300 may determine the display area of the held housing (i.e., the housing with less movement) to be the active area. When the electronic device 300 is in the unfolded state, the entire area of the display 399 (e.g., both the first display area 311 and the second display area 321) may be determined as the active area.

According to various embodiments, the first housing 310 may include a first surface (first display area) 311 facing in a first direction (e.g., a forward direction) (the z-axis direction) and a second surface 312 facing in a second direction (e.g., a backward direction) (the −z-axis direction) opposite the first surface 311 in the unfolded state. The second housing 320 may include a third surface (second display area) 321 facing in the first direction (e.g., the z-axis direction) and a fourth surface 322 facing in the second direction (e.g., the −z-axis direction) in the unfolded state. The electronic device 300 may operate such that the first surface 311 of the first housing 310 and the third surface 321 of the second housing 320 face in the same first direction (e.g., the z-axis direction) in the unfolded state and such that the first surface 311 and the third surface 321 face each other in the folded state. The electronic device 300 may operate such that the second surface 312 of the first housing 310 and the fourth surface 322 of the second housing 320 face in the same second direction (the −z-axis direction) in the unfolded state and such that the second surface 312 and the fourth surface 322 face in the directions opposite to each other in the folded state.

According to various embodiments, the first housing 310 may include a first side frame 313 forming a part of the exterior of the electronic device 300 and a first rear cover 314 coupled to the first side frame 313 and forming at least a portion of the second surface 312 of the electronic device 300. According to an embodiment, the first side frame 313 may include a first side surface 313a, a second side surface 313b extending from one end of the first side surface 313a, and a third side surface 313c extending from the other end of the first side surface 313a. According to an embodiment, the first side frame 313 may be formed in a rectangular (e.g., square or oblong) shape by the first side surface 313a, the second side surface 313b, and the third side surface 313c.

According to various embodiments, the second housing 320 may include a second side frame 323 forming a part of the exterior of the electronic device 300 and a second rear cover 324 coupled to the second side frame 323 and forming at least a portion of the fourth surface 322 of the electronic device 300. According to an embodiment, the second side frame 323 may include a fourth side surface 323a, a fifth side surface 323b extending from one end of the fourth side surface 323a, and a sixth side surface 323c extending from the other end of the fourth side surface 323a. According to an embodiment, the second side frame 323 may be formed in a rectangular shape by the fourth side surface 323a, the fifth side surface 323b, and the sixth side surface 323c.

According to various embodiments, a pair of housings 310 and 320 is not limited to the illustrated shape and coupling and may be implemented by a combination and/or coupling of other shapes or components. For example, the first side frame 313 may be integrally formed with the first rear cover 314, and the second side frame 323 may be integrally formed with the second rear cover 324.

According to various embodiments, the first rear cover 314 and the second rear cover 324 may be formed of at least one of, for example, coated or tinted glass, ceramic, polymer, or metal (e.g., aluminum, stainless steel (STS), or magnesium) or a combination of two or more of them.

According to various embodiments, the electronic device 300 may include a first protective cover 315 (e.g., a first protective frame or a first decorative member) coupled along the edge of the first housing 310. The electronic device 300 may include a second protective cover 325 (e.g., a second protective frame or a second decorative member) coupled along the edge of the second housing 320. According to an embodiment, the first protective cover 315 and the second protective cover 325 may be formed of a metal or polymer material.

According to various embodiments, the electronic device 300 may include a sub-display 331 disposed separately from the display 399. According to an embodiment, the sub-display 331 may be disposed to be exposed through a portion of the second surface 312 so as to display state information of the electronic device 300 in the folded state. According to an embodiment, the sub-display 331 may be disposed to be visible from the outside through at least a partial area of the first rear cover 314. In some embodiments, the sub-display 331 may be disposed on the fourth surface 322 of the second housing 320. In this case, the sub-display 331 may be disposed to be visible from the outside through at least a partial area of the second rear cover 324.

According to various embodiments, the electronic device 300 may include at least one of an input device 303, sound output devices 301 and 302, camera modules 305 and 308, a key input device 306, a connector port 307, a light source 309, and a sensor module (not shown). In an embodiment, the sensor module (e.g., the sensor module 176 in FIG. 1) and the camera 305 may be disposed under the display 399 when viewing the front surface.

Referring to FIG. 3F, the electronic device 300 according to various embodiments may include a first side frame 313, a second side frame 323, and a hinge module 340 rotatably connecting the first side frame 313 and the second side frame 323. According to an embodiment, the electronic device 300 may include a first support plate 3131 at least partially extending from the first side frame 313 and a second support plate 3231 at least partially extending from the second side frame 323. According to an embodiment, the first support plate 3131 may be formed integrally with the first side frame 313 or structurally coupled to the first side frame 313. Similarly, the second support plate 3231 may be formed integrally with the second side frame 323 or structurally coupled to the second side frame 323. According to an embodiment, the electronic device 300 may include a display 399 disposed to be supported by the first support plate 3131 and the second support plate 3231. According to an embodiment, the electronic device 300 may include a first rear cover 314 coupled to the first side frame 313 and providing a first space between the first support plate 3131 and the same, and a second rear cover 324 coupled to the second side frame 323 and providing a second space between the second support plate 3231 and the same. In some embodiments, the first side frame 313 and the first rear cover 314 may be integrally formed. In some embodiments, the second side frame 323 and the second rear cover 324 may be integrally formed. According to an embodiment, the electronic device 300 may include a first housing 310 provided by the first side frame 313, the first support plate 3131, and the first rear cover 314. According to an embodiment, the electronic device 300 may include a second housing 320 provided by the second side frame 323, the second support plate 3231, and the second rear cover 324.

According to various embodiments, the electronic device 300 may include a first substrate assembly 361 (e.g., a main printed circuit board), a camera assembly 363, a first battery 371, or a first bracket 351 disposed in the first space between the first side frame 313 and the first rear cover 314. According to an embodiment, the camera assembly 363 may include a plurality of cameras (e.g., the camera modules 305 and 308 in FIGS. 3A and 3C) and may be electrically connected to the first substrate assembly 361. According to an embodiment, the first bracket 351 may provide a support structure and improved rigidity for supporting the first substrate assembly 361 and/or the camera assembly 363. According to an embodiment, the electronic device 300 may include a second substrate assembly 362 (e.g., a sub-printed circuit board), an antenna 390 (e.g., a coil member), a second battery 372, or a second bracket 352 disposed in the second space between the second side frame 323 and the second rear cover 324. According to an embodiment, the electronic device 300 may include a wire member 380 (e.g., a flexible printed circuit board (FPCB)) that is disposed to extend from the first substrate assembly 361 to a plurality of electronic components (e.g., the second substrate assembly 362, the second battery 372, or the antenna 390) disposed between the second side frame 323 and the second rear cover 324 across the hinge module 340 and provides electrical connections.

According to various embodiments, the electronic device 300 may include a hinge cover 341 that supports the hinge module 340 and configured to be exposed to the outside when the electronic device 300 is in the folded state and enter the first space and the second space when the electronic device 300 is in the unfolded state so as to be invisible from the outside.

According to various embodiments, the electronic device 300 may include a first protective cover 315 coupled along the edge of the first side frame 313. According to an embodiment, the electronic device 300 may include a second protective cover 325 coupled along the edge of the second side frame 323. An edge of the first display area 311 of the display 399 may be protected by the first protective cover 315. An edge of the second display area 321 may be protected by the second protective cover 325. A protective cap 335 may be disposed in an area corresponding to the hinge module 340 so as to protect a bent portion at the edge of the display 399.

Figure 4A:
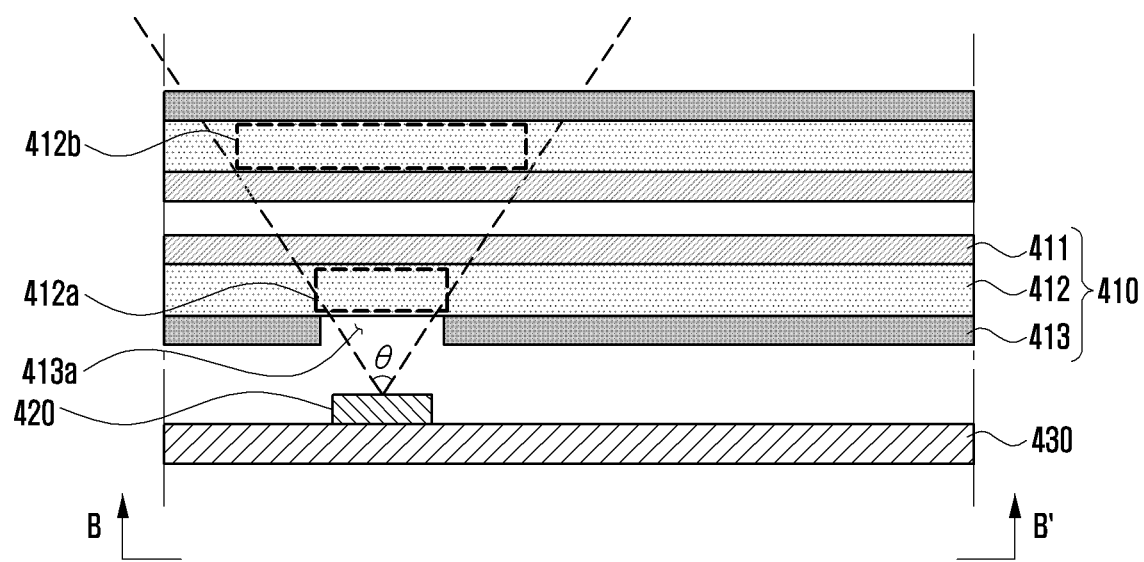
FIG. 4A illustrates a cross-section of a display and an illuminance sensor disposed under the display when the display is in a folded state, according to an embodiment.
Figure 4A:
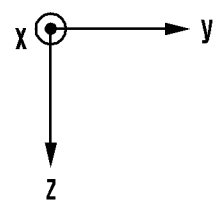
Figure 4B:
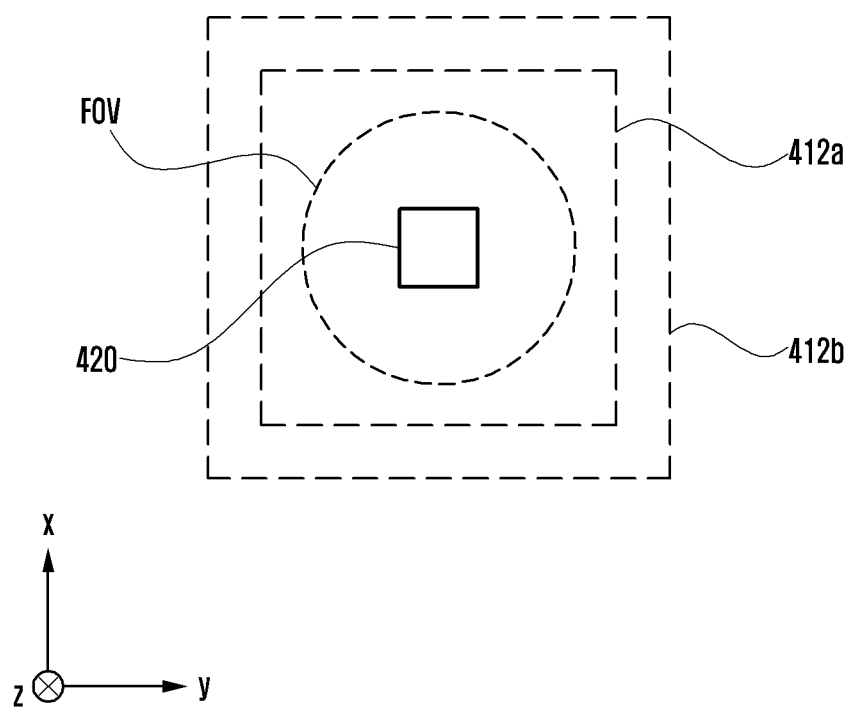
FIG. 4B illustrates a view of a structure in which an illuminance sensor, a sensor area, and a facing area overlap each other when the display is in a folded state, according to an embodiment.

FIG. 4A illustrates a cross-section view of a display and an illuminance sensor disposed under the same (e.g., a view showing a part of the electronic device taken in a direction BB' in FIG. 3C) when the display is in a folded state, according to an embodiment, and FIG. 4B illustrates a view of a structure in which an illuminance sensor, a sensor area, and a facing area overlap each other when the display is in a folded state, according to an embodiment. Referring to FIGS. 4A and 4B, a display 410 and an illuminance sensor 420 may be disposed inside the in-folding type housing described above with reference to FIGS. 3A-3F.

The display 410 (e.g., the display 399 in FIG. 3A) may include a first protective cover 411, a display panel 412 (e.g., the display panel 210 in FIG. 2), and a second protective cover 413. When viewing the display 410 in the z-axis direction, the first protective cover 411 may be attached to the front surface of the display panel 412 and may be implemented by, for example, a flexible and transparent material (e.g., colorless polyimide (CPI)). The second protective cover 413 may be attached to the rear surface of the display panel 412 and may include a metal layer (e.g., a copper (Cu) sheet) and/or a light-blocking layer (e.g., a black "embo layer": a layer including an embossed or otherwise uneven pattern). When viewing the display 410 in the z-axis direction, the illuminance sensor 420 (e.g., an ambient light sensor (ALS)) may be positioned under the second protective cover 413 and disposed on a substrate assembly 430. An opening 413a may be formed in a portion of the second protective cover 413 disposed above the illuminance sensor 420 so that the illuminance sensor 420 may sense external light. The illuminance sensor 420 may include a light-receiving part for sensing external light. The light-receiving part may include at least one photodiode. The opening 413a may be formed in a position and/or a size corresponding to the angle θ of a field of view (FOV) of the light-receiving part of the illuminance sensor 420. In an embodiment, a sensor area 412a (e.g., the sensor area 342a in FIG. 3A) of the display panel 412 may be formed in a position and/or a size corresponding to the angle θ of a field of view. Upon calibration of the illuminance sensor 420, the processor 120 may display an image in a specified color (e.g., white, gray, black, or other colors) on the sensor area 412a. In an embodiment, the image in a specified color may include an image having the brightness and/or color sufficient to enable a calibration operation of the illuminance sensor. Here, the calibration may be defined as an operation of calculating a value used for correcting an illuminance value measured by the illuminance sensor 420. In addition, the processor 120 may display the image of a specified color (e.g., white or black) on a facing area 412b (e.g., the facing area 342b in FIG. 3A). For example, a portion disposed directly above the illuminance sensor 420 so as to overlap the same in the display panel 412, when viewed in the z-axis direction, and surrounding the field of view (FOV) thereof may be specified as a sensor area 412a. A portion disposed above the sensor area 412a so as to overlap the same in the display panel 412, when the display 410 is viewed in the z-axis direction, and surrounding the sensor area 412a in the folded state may be specified as the facing area 412b. The processor 120 may display images having colors of different lightness (e.g., white or black) or images having colors of the same lightness (e.g., white) on the sensor area 412a and the facing area 412b.

The illuminance sensor 420 may include a package further including a light-emitting part (e.g., a light-emitting diode). For example, the illuminance sensor 420 including the light-emitting part may operate as a proximity sensor. As another example, the illuminance sensor 420 may include a proximity illuminance sensor in which an illuminance sensor and a proximity sensor are combined into one device (or module). In another embodiment, although not shown, the illuminance sensor 420 may be included in a display panel (e.g., the display panel 210 in FIG. 2). For example, the light-receiving portion (e.g., a photodiode) may be included in a pixel included in the display panel 210, thereby measuring the illuminance. In this case, the opening 413a may not be formed. In addition, the sensor area 412a may be formed in a position and/or size corresponding to the pixel including the light-receiving part. Those skilled in the art will readily understand that the illuminance sensor 420 is not limited to the above examples.

Figure 5:
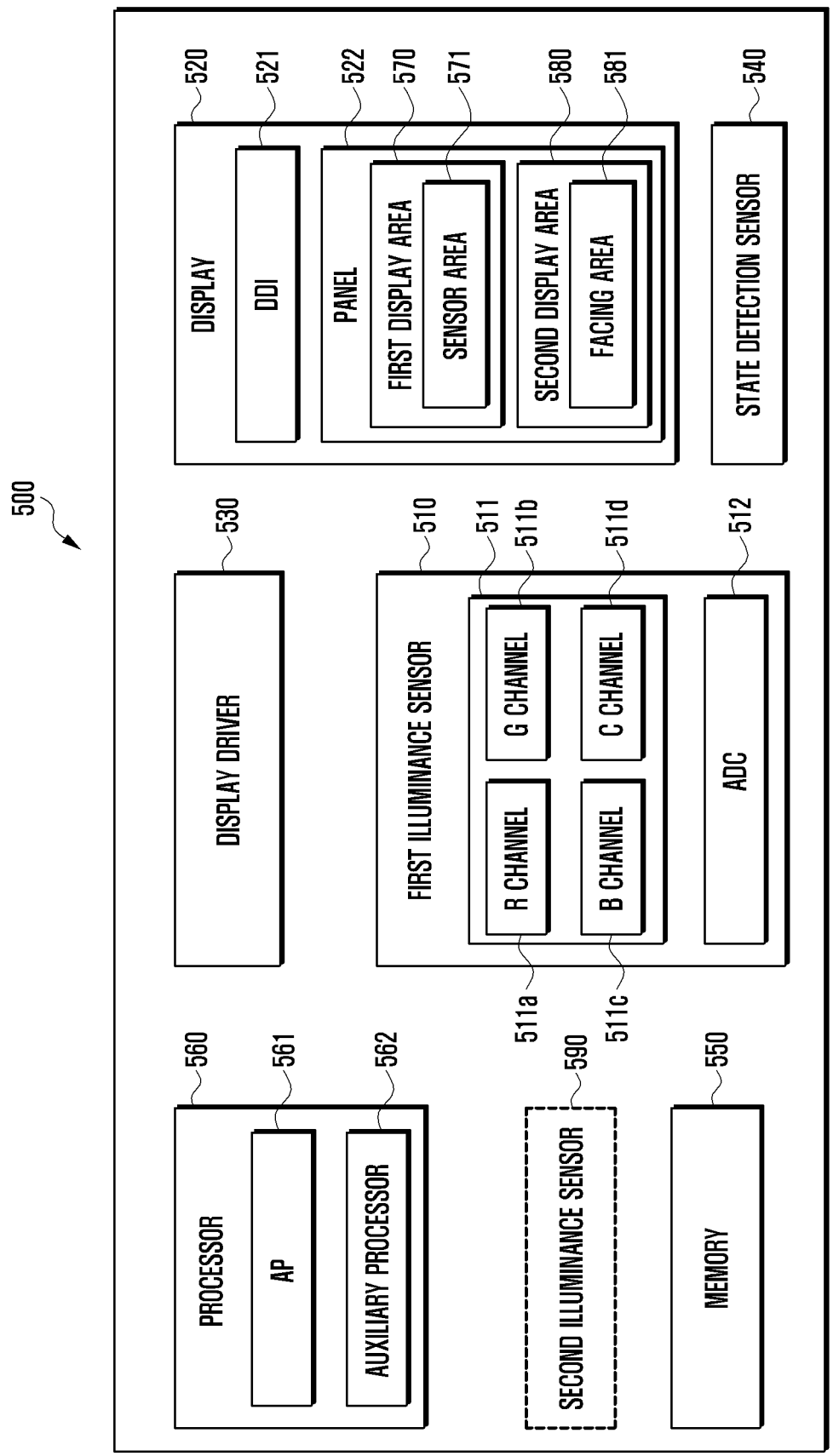
FIG. 5 is a block diagram illustrating a configuration of a portable electronic device, according to various embodiments.

FIG. 5 is a block diagram illustrating a configuration of a portable electronic device 500, according to various embodiments. Referring to FIG. 5, an electronic device 500 (e.g., the electronic device 101 in FIG. 1) may include a first illuminance sensor 510, a display 520, a display driver 530, a state detection sensor 540, a memory 550, and a processor 560.

The first illuminance sensor 510 (e.g., the illuminance sensor 420 in FIG. 4) may produce data used for identifying the ambient illuminance of the electronic device 500. In an embodiment, the first illuminance sensor 510 may include at least one photodiode and may be implemented as a single module (e.g., ASIC). The first illuminance sensor 510 may be mold-processed (e.g., clear molding) to protect internal elements.

The first illuminance sensor 510 may include a light-receiving part 511 for reading RGB values of a visible light and an analog-to-digital converter (ADC) 512 for digitizing the RGB values, and may output the digitized RGB values (ADC values) to the processor 560. For example, the light-receiving part 511 may include at least one photodiode that responds to the visible light (e.g., light having a wavelength of about 400 to 750 nm). The light-receiving part 511 may further include a photodiode for receiving an infrared ray. The light-receiving part 511 may include an element (e.g., a cadmium sulfide (CdS) element) having a photoelectric effect in which the conductivity changes due to generation of electrons moving inside the element when light energy (or light) is received from an external light source. If the light-receiving part 511 faces an external light source, a current may be generated by the photoelectric effect. The ADC 512 may convert the current into digital data (e.g., an ADC value) and transmit the same to the processor 560. For example, if the light from the external light source is strong, data indicating a high level of illuminance may be output to the processor 560, and if the light from the external light source is weak, data indicating a relatively low level of illuminance may be output to the processor 560. The processor 560 may convert data received from the first illuminance sensor 510 into an illuminance value and control the brightness (or lightness) of the display 520, based on the illuminance value.

The light-receiving part 511 may include a plurality of channels capable of receiving light. In an embodiment, the light-receiving part 511 may include a red (R) channel 511a for receiving light of a red hue (e.g., light having a wavelength of about 550 nm to 700 nm), a green (G) channel 511b for receiving light of a green hue (e.g., light having a wavelength of about 450 nm to 650 nm), a blue (B) channel 511c for receiving light of a blue hue (e.g., light having a wavelength of about 400 nm to 550 nm), and/or a clear (C) channel 511d for receiving a white light (e.g., all of R, G, and B). At least one of the channels 511a, 511b, 511c, and 511d may include a photodiode. The R, G, and B channels 511a, 511b, and 511c may include a filter through which the light of a corresponding hue passes.

In addition to the photodiode, the first illuminance sensor 510 may include various sensors based on light, such as a color detection sensor (e.g., a picker sensor), a flicker sensor, an image sensor, a photoplethysmography (PPG) sensor, a proximity sensor, an iris sensor, a spectrometer sensor, or an ultraviolet sensor. Alternatively, the first illuminance sensor 510 may be included in the display 520.

The electronic device 500 may further include a second illuminance sensor 590. The first illuminance sensor 510 (e.g., the illuminance sensor 420 in FIG. 4A) may be disposed under the front surface of the electronic device 500 such that the field of view thereof faces in a first direction that is the same as the direction in which the front surface of the electronic device 500 faces. The second illuminance sensor 590 may be disposed under the rear surface of the electronic device 500 such that the field of view thereof faces in a second direction that is the same as the direction in which the rear surface (e.g., the second surface 312 or the fourth surface 322 in FIG. 3D) of the electronic device 500 faces. For example, a sub-display may be disposed on the rear surface, and the second illuminance sensor 590 may be disposed under the sub-display.

The display 520 (e.g., the display module 160 in FIG. 1) may include a DDI 521 and a display panel 522. The DDI 521 (e.g., the DDI 230 in FIG. 2) may control the panel 522 (e.g., the display panel 210 in FIG. 2) to display image information. In an embodiment, the DDI 521 may control the panel 522 to output image information in units of frames. The DDI 521 may provide color information of a video (or image) to be output (or having been output) to other elements (e.g., the processor 560). For example, the color information may include color-on-pixel-ratio (COPR) information. As an example, the COPR information may indicate a ratio of R/G/B (R value, G value, and B value) in image data to be output to a specified area of the display 520. For example, the COPR information may indicate an average of R values, an average of G values, and an average of B values to be displayed in each of the pixels included in the specified area. The R average value is a red color value, which may be a value between 0 to 255, the G average value is a green color value, which may be a value between 0 to 255, and the B average value is a blue color value, which may be a value between 0 to 255. For example, COPR information of an area displaying a white portion included in an image to be displayed on the display 520 may have a value of (R, G, B: 255, 255, 255). The specified area may include, for example, at least one of an area in which an image is being displayed, an entire active area (e.g., a first display area 570 including a sensor area 571) of the display 520, a sensor area 571, or a plurality of sections partitioned in the active area, and the plurality of sections may be distinguished by pixel coordinate values stored in the memory 550 or physical position information of an area. The physical position information of an area, for example, may be information (e.g., a wire number) about at least one of wires (e.g., gate line (GL) wires, data line (DL) wires, and a plurality of power wires (VDD wires, VSS wires, or Vcas wires)) included in the display 520 and include wire information partitioning the area.

The panel 522 may include a first display area 570 (e.g., the first display area 311 in FIG. 3A) and a second display area 580 (e.g., the second display area 321 in FIG. 3A) substantially facing the first display area 570 when the electronic device 500 is in the folded state. The first illuminance sensor 510 may be disposed under the first display area 570. Accordingly, the processor 560 may specify at least a portion of the first display area 570 as the sensor area 571 (e.g., the sensor area 342a in FIG. 3A), based on the position and FOV angle of the first illuminance sensor 510. The sensor area 571 may be specified when the electronic device 500 is manufactured or booted up, and information about the area specified as the sensor area 571 may be stored in the memory 550. For example, the information about the area may include at least one of coordinate values of the pixels corresponding to the sensor area 571 or physical position information (e.g., wire information) of the sensor area 571. The processor 560 may specify at least a portion of the second display area 580 as a facing area 581 (e.g., the facing area 342b in FIG. 3A). For example, the processor 560 may specify at least a portion of the second display area 580 as the facing area 581, based on the position and size of the sensor area 571. The facing area 581 may be specified when the electronic device 500 is manufactured or booted up, and information thereof may be stored in the memory 550.

The display driver 530 may perform an operation of adjusting the illuminance of the display 520 according to an illuminance value obtained using the first illuminance sensor 510. In an embodiment, the display driver 530 may perform an operation of adjusting the brightness of the display 520 in real time according to an illuminance value obtained using the first illuminance sensor 510, based on a first command of the processor 560. For example, the display driver 530 may receive data (e.g., real time (RT) flag) indicating a first command from the processor 560 and perform a real-time adjustment operation according thereto. Based on a second command of the processor 560, the display driver 530 may perform an operation (hereinafter, a hysteresis adjustment operation) of maintaining the brightness of the display 520 if the illuminance value obtained using the first illuminance sensor 510 falls within a specified illuminance range and adjusting the brightness of the display 520 if the illuminance value obtained using the first illuminance sensor 510 falls outside of the illuminance range. For example, the processor 560 may stop transmitting data indicating the first command as the second command, and the display driver 530 may perform the hysteresis adjustment operation according thereto. Compared to the real-time adjustment operation, the hysteresis adjustment operation may prevent the display brightness from changing frequently. For example, the display may become brighter according to an increase in the illuminance in the case of the real-time adjustment operation, whereas the brightness of the display may be maintained in the case of the hysteresis adjustment operation even if the illuminance is increased to the same value.

The display driver 530 may be implemented by software. Accordingly, the processor 560 may also be configured to execute the display driver 530, thereby performing the brightness adjustment operation of the display driver 530. In this case, the operation of the display driver 530 may denote the operation of the processor 560.

The state detection sensor 540 (e.g., the sensor module 176 in FIG. 1) may produce data used for recognizing a state of the electronic device 500 (e.g., a folded state, an intermediate state, or an unfolded state). In an embodiment, if the electronic device 500 includes a foldable housing, the state detection sensor 540 may include a sensor (e.g., an encoder, or a Hall sensor) attached to a hinge assembly (e.g., the hinge assembly 340 in FIG. 3F) and producing and outputting data corresponding to an angle. In another embodiment, the state detection sensor 540 may include a motion sensor (e.g., an acceleration sensor and/or a gyro sensor) disposed in the inner space of the housing of the electronic device 500. For example, the state detection sensor 540 may include a first motion sensor disposed in a first housing (e.g., the first housing 310 in FIG. 3A) and producing data corresponding to the position and/or motion (e.g., angular velocity and/or acceleration) of the first housing, and a second motion sensor disposed in a second housing (e.g., the second housing 320 in FIG. 3A) and producing data corresponding to the position and/or motion of the second housing. In another embodiment, the state detection sensor 540 may be configured as a combination of a Hall sensor and an acceleration sensor.

The memory 550 (e.g., the memory 130 in FIG. 1) may store a lookup table used in the brightness adjustment operation (e.g., the real-time adjustment operation or the hysteresis adjustment operation). For example, the processor 560 may identify a brightness value corresponding to the ambient illuminance from the lookup table for real-time adjustment and configure the identified value as the brightness of the display 520. The processor 560 may configure, as the brightness of the display 520, a brightness (e.g., wake-up brightness) value corresponding to the illuminance (e.g., wake-up illuminance) obtained from the first illuminance sensor 510 immediately before the display 520 is turned on and turn on the display 520. After turning on, the processor 560 may perform the hysteresis adjustment operation with reference to a lookup table for hysteresis adjustment. For example, if the wake-up illuminance is 10 lux, the processor 560 may configure the down hysteresis as 1 lux and the up hysteresis as 81 lux with reference to the lookup table. Accordingly, if the measured illuminance is 1 lux or less, the brightness of a screen may be configured to be lower than the wake-up brightness. If the measured illuminance is 81 lux or more, the brightness of a screen may be configured to be higher than the wake-up brightness.

The memory 550 may store instructions that, when executed, cause the processor 560 to perform the brightness adjustment operation of the display driver 530, based on data received from the first illuminance sensor 510. The memory 550 may be a memory of the DDI 521 or may include at least a part of the memory.

The instructions may enable the processor 560 to perform an operation of recognizing that the electronic device 500 is in the state of triggering a calibration operation (hereinafter, a calibration trigger state) for the first illuminance sensor 510, an operation of displaying an image of a specified brightness or color in the sensor area 571 and/or the facing area 581 according to the recognition, an operation of calculating an illuminance value using data received from the first illuminance sensor 510, an operation of comparing the calculated illuminance value with an illuminance value (e.g., an illuminance value calculated from typical performance samples under the same condition) stored in the memory 550, an operation of calculating a calibration value used for calibrating an illuminance value measured by the first illuminance sensor 510, based on the comparison result, an operation of storing the calculated calibration value in the memory 550, an operation of calculating an illuminance value using data received from the first illuminance sensor 510 and the calibration value stored in the memory 550, an operation of calculating an illuminance value (noise component) corresponding to the brightness of the sensor area 571, based on color information (e.g., COPR information) of a portion of the image displayed on the first display area 570, which is displayed on the sensor area 571, an operation of removing noise components from the calculated illuminance value to correct the calculated illuminance value such that it converges to the actual illuminance value around the electronic device 500, and an operation of configuring the brightness of the display 520 using the corrected illuminance value.

The calibration operation may be automatically performed in a situation in which the user is not aware of the operation is in progress. To this end, the calibration trigger state may include a folded state of the electronic device 500. The calibration trigger state may include the state in which the electronic device 500 is in the folded state and in which the current time is a specified dawn time. The calibration trigger state may include the state in which the electronic device 500 is in the folded state and in which a battery of the electronic device 500 is being charged. The calibration trigger state may include the state in which the electronic device 500 is in the folded state incapable of measuring the ambient illuminance using the first illuminance sensor 510 and in which the illuminance value measured using the second illuminance sensor 590 indicates a bright environment, as identified according to one or more predetermined criteria for brightness. The calibration trigger state may include the state in which the electronic device 500 is in the folded state and in which the electronic device 500 is placed on a flat floor. For example, the processor 560 may recognize that the electronic device 500 is placed on a flat floor, based on data produced by a gyro sensor. The calibration trigger state may include the state in which the electronic device 500 is in the folded state and in which the electronic device 500 does not move. For example, the processor 560 may recognize that the electronic device 500 is in a stationary state, based on data produced by an acceleration sensor.

Table 1 shows illuminance values (LUX) measured from a minimum performance sample (MIN), a typical performance sample (TYP), and a maximum performance sample (MAX) under the conditions of the same brightness of the sensor area. Table 1 may show illuminance values measured from the samples divided into a minimum performance sample, a typical performance sample, and a maximum performance sample according to the difference between the samples (e.g., the electronic device 500) according to the illuminance measurement performance. In Table 1, CH0 may indicate first raw data of a corresponding sample received from channel 0, CH1 may indicate second raw data of a corresponding sample received from channel 1, and LUX may indicate an illuminance value obtained by applying first raw data and second raw data to a given equation. In an embodiment, CH0 or CH1 may indicate one of a red (R) channel, a green (G) channel, a blue (B) channel, or a clear (C) channel. In Table 1, the ratio may indicate the ratio (=illuminance value/reference value of each sample) of an illuminance value of each sample to a reference value (TYP illuminance value). Referring to Table 1, it can be seen that the ratios are the same up to one decimal place when the brightness is 50 or more and that the ratios are the same up to two decimal places when the brightness is 100 or more.

TABLE 1

| | | | | | | Brightness | | | | | | |
|---|---|---|---|---|---|---|---|---|---|---|---|---|
| | | 50 | | | 100 | | | 200 | | | 255 | |
| Channel | CH0 | CH1 | LUX | CH0 | CH1 | LUX | CH0 | CH1 | LUX | CH0 | CH1 | LUX |
| MIN | 553 | 41 | 116.076 | 1081 | 82 | 226.252 | 2407 | 187 | 502.228 | 4009 | 313 | 835.948 |
| TYP | 739 | 57 | 154.34 | 1474 | 117 | 306.68 | 3299 | 261 | 686.692 | 5454 | 434 | 1134.376 |
| MAX | 811 | 63 | 169.22 | 1600 | 131 | 331.488 | 3588 | 290 | 744.688 | 5916 | 479 | 1227.568 |
| | Ratio | | 0.752 | Ratio | | 0.737 | Ratio | | 0.731 | Ratio | | 0.736 |
| | | | 1 | | | 1 | | | 1 | | | 1 |
| | | | 1.096 | | | 1.080 | | | 1.084 | | | 1.082 | same; e.g., in which the user is not expected to interact with the electronic device 500 or particular components thereof, and to thereby notice the calibration operation, while the According to an embodiment, the memory 550 may store Table 1 above as a first lookup table used in the calibration value calculation operation. According to another embodiment, in Table 1, the memory 550 may store an illuminance value measured in the typical performance sample when the brightness is 100, 200, and/or 255, which are conditions in which the ratios thereof matches each other up to two decimal places, as a first lookup table (e.g., Table 2 below) used in the calibration value calculation operation. The instructions may enable the processor 560 to perform an operation of configuring the brightness of the sensor area 571 and/or facing area 581 as the brightness value (100, 200, or 255) specified in the first lookup table, based on the electronic device 500 in the calibration trigger state, an operation of calculating an illuminance value using data received from the first illuminance sensor 510, an operation of calculating a ratio of the calculated illuminance value to a reference value corresponding to the brightness value configured in the first lookup table, and an operation of storing the calculated ratio as a calibration value in the memory 550 (e.g., an operation of updating the ratio previously stored in the memory 550 with the calculated ratio). The processor 560 may calibrate the illuminance value measured by the first illuminance sensor 510 using the ratio (calibration value) to converge to the illuminance value measured from the typical performance sample (TYP). For example, the processor 560 may calibrate the illuminance value measured by the first illuminance sensor 510 so as to converge to the illuminance value measured from the typical performance sample (TYP) by multiplying the illuminance value measured by the first illuminance sensor 510 by the reciprocal of the ratio (=illuminance value/reference value of each sample).

TABLE 2

| Brightness | 100 | 200 | 255 |
|---|---|---|---|
| LUX | 306.68 | 686.692 | 1134.376 |

Table 3 shows illuminance values (LUX) measured from a minimum performance sample (MIN), a typical performance sample (TYP), and a maximum performance sample (MAX) under the conditions of the same state of the electronic device and the same combination of colors of images displayed in the sensor area and facing area. In Table 3, CH0 may indicate first raw data of a corresponding sample received from channel 0 for a specified time (e.g., 16 ms, 25 ms, or 50 ms), and CH1 may indicate second raw data of a corresponding sample received from channel 1 for the specified time. LUX may indicate an illuminance value obtained by applying first raw data CH0 and second raw data CH1 to a given equation (e.g., 0.236*CH0−0.352*CH1 in the case of a=0.236 and b=−0.352). In Table 3, the ratio may indicate the ratio of a reference value (TYP illuminance value) to an illuminance value of each sample (=reference value/illuminance value of each sample). In Table 3, the reference value (TYP illuminance value) may be an average of illuminance values measured using a plurality of samples (e.g., 1000 or more samples). Referring to Table 3, it can be seen that the ratios match each other up to one decimal place, except when the images displayed on the sensor area and the facing area are white/white. It can be seen that the ratios of all color combinations match each other up to one decimal place in consideration of rounding off. As described above, the constant ratio regardless of the color combinations may indicate that the difference between samples may be constantly remain even if a white image is displayed in any one of the sensor area or the facing area and that Table 3 may be utilized as a lookup table used in the calibration operation of the illuminance sensor.

TABLE 3 a = 0.236
b = −0.352

| State | Sensor area | Facing area | | | | = a*CH0 + b*CH1 | |
|---|---|---|---|---|---|---|---|
| Folded state | Black | White | Performance | CH0 | CH1 | LUX | Ratio |
| | | | MIN | 4062 | 329 | 843 | 1.315 |
| | | | TYP | 5323 | 420 | 1108 | 1 |
| | | | MAX | 6414 | 515 | 1332 | 0.831 |
| | White | White | Performance | CH0 | CH1 | LUX | Ratio |
| | | | MIN | 5376 | 449 | 1111 | 1.309 |
| | | | TYP | 7012 | 568 | 1455 | 1 |
| | | | MAX | 8915 | 733 | 1846 | 0.788 |
| | White | Black | Performance | CH0 | CH1 | LUX | Ratio |
| | | | MIN | 1182 | 107 | 241 | 1.358 |
| | | | TYP | 1598 | 140 | 328 | 1 |
| | | | MAX | 1957 | 173 | 401 | 0.817 |
| Unfolded state | Black | White | Performance | CH0 | CH1 | LUX | Ratio |
| | | | MIN | 942 | 88 | 191 | 1.34 |
| | | | TYP | 1256 | 111 | 257 | 1 |
| | | | MAX | 1528 | 135 | 313 | 0.82 |

According to an embodiment, the memory 550 may store Table 3 above as a second lookup table used in the calibration value calculation operation. According to another embodiment, the memory 550 may store the illuminance value measured from the typical performance sample (TYP) in Table 3 as a second lookup table (e.g., Table 4 below) used in the calibration value calculation operation. The instructions may enable the processor 560 to perform an operation of configuring the color of a first image to be displayed on the sensor area 571 and the color of a second image to be displayed on the facing area 581 using a combination of colors specified in the second lookup table, based on the electronic device 500 in the calibration trigger state, an operation of calculating an illuminance value using data received from the first illuminance sensor 510, an operation of calculating the ratio of the reference value corresponding to the color combination configured from the second lookup table to the calculated illuminance value, and an operation of storing the calculated ratio in the memory 550 as a calibration value. The first illuminance sensor 510 may be calibrated to converge to the performance of the typical performance sample (TYP) by multiplying the ratio (calibration value) by the illuminance value measured by the first illuminance sensor 510. For example, if the LUX obtained by the first illuminance sensor 510 is 900 when the color combination is black/white, the processor 560 may store a ratio 1.23 (=1108/900) as a calibration value in the memory 550. If the obtained LUX is 1300, the processor 560 may store a ratio 0.85 (=1108/1300) as a calibration value in the memory 550. Thereafter, the processor 560 may remove the difference of the illuminance value measured by the first illuminance sensor 510 using the calibration value. For example, if the calibration value is 1.23, the processor 560 may increase the illuminance value by multiplying the measured illuminance value by 1.23. If the calibration value is 0.85, the processor 560 may reduce the illuminance value by multiplying the measured illuminance value by 0.85.

TABLE 4

|  | Sensor area | Facing area | LUX |
|---|---|---|---|
| Folded state | Black | White | 1108 |
|  | White | White | 1455 |
|  | White | Black | 328 |
| Unfolded state | White | — | 257 |

If there are foreign substances between the sensor area 571 and the facing area 581, an error may occur in the calibration of the first illuminance sensor 510. For example, the calibration value may be miscalculated. Alternatively, the first illuminance sensor 510 may be mistaken to malfunction because the difference between the measured illuminance value and the TYP illuminance value is greater than or equal to a predetermined value. If the difference is greater than or equal to the predetermined value, the calibration operation for the first illuminance sensor 510 may be cancelled.

According to an embodiment, the electronic device 500 may include a plurality of illuminance sensors disposed under the first display area 570. For example, the electronic device 500 may further include a third illuminance sensor disposed apart from the first illuminance sensor 510. Accordingly, the sensor area 571 may include a first sensor area corresponding to the first illuminance sensor 510 and a second sensor area corresponding to the third illuminance sensor, and the facing area 581 may include a first facing area and a second facing area. The memory 550 may store Table 5 below as a lookup table used for the calibration value calculation operation.

TABLE 5

|  | Sensor area | | Facing area | | |
|---|---|---|---|---|---|
|  | Position information | Color information | Position information | Color information | LUX |
| Folded state | First sensor area | Black | First facing area | White | 1108 |
|  | Second sensor area |  | Second facing area |  | 1108 |
|  | — | — | — | — | — |
|  | — | — | — | — | — |

The processor 560 (e.g., the processor 120 in FIG. 1) may include an application processor (AP) 561 and/or an auxiliary processor 562 and may be operatively connected to the illuminance sensors 510 and 590, the display 520, the display driver 530, the state detection sensor 540, and the memory 550. The processor 560 may perform an operation (e.g., a real-time adjustment operation or a hysteresis adjustment operation) of adjusting the brightness of the display 520, based on data received from the first illuminance sensor 510, the second illuminance sensor 590, and/or the state detection sensor 540. The auxiliary processor 562 (e.g., a sensor hub processor) may control the overall operation of a sensor module (e.g., the sensor module 176 in FIG. 1). The auxiliary processor 562 may be used to collect and process data from the sensor module with lower power than the AP 561. For example, the auxiliary processor 562 may convert data received from the first illuminance sensor 510 into an illuminance value and remove a difference of the illuminance value using a calibration value. The auxiliary processor 562 may correct the illuminance value using data (e.g., color information of visual information to be displayed on the sensor area 571 and/or facing area 581) received from the display 520 (e.g., the DDI 521), thereby preventing distortion of ambient illuminance according to the driving of the display 520. The auxiliary processor 562 may read a brightness value corresponding to the illuminance value from the lookup table (e.g., a lookup table for real-time adjustment or hysteresis adjustment) and transmit the same to the DDI 521, thereby adjusting the brightness of the display 520. The auxiliary processor 562 may be omitted from the configuration of the electronic device 500, and the AP 561 may perform the function of the auxiliary processor 562 according thereto.

The processor 560 (e.g., the AP 561 and/or the auxiliary processor 562) may recognize the state of the electronic device 500 using data received from the state detection sensor 540. For example, the processor 560 may calculate an angle formed between the display areas 570 and 580 using data received from the state detection sensor 540 and recognize the state of the electronic device 500, based on data obtained as the calculation result. As described above with reference to FIGS. 3A-3E, the processor 560 may determine an active area in which visual information is to be displayed based on the state of the electronic device 500.

The processor 560 (e.g., the AP 561 and/or the auxiliary processor 562) may configure a measurement time (e.g., integration time) and a measurement period for obtaining light by the first illuminance sensor 510, based on a period of turning on and turning off the display 520 and/or a ratio of turn-off (e.g., AMOLED off ratio (AOR)). For example, the display 520 may display a frame while repeating turning-on and turning-off several times. In an embodiment, the ambient illuminance of the electronic device 500 may be distorted due to the effect of turning on the display 520. To prevent such distortion, the processor 560 may convert data received from the first illuminance sensor 510 into an illuminance value at the time at which the display 520 is turned off.

The processor 560 (e.g., the AP 561 and/or auxiliary processor 562) may measure the ambient illuminance of the electronic device 500 using data received from the first illuminance sensor 510. The processor 560 may calibrate the illuminance value obtained as a result of the measurement using a calibration value stored in the memory 550. The processor 560 may correct the calibrated illuminance value, based on color information of an image displayed on the panel 522 (e.g., the sensor area 571 and/or facing area 581), thereby preventing distortion of the ambient illuminance caused by the driving of the display 520.

The processor 560 may perform an operation of updating the calibration value when the electronic device 500 is in the calibration trigger state as described above.

Figure 6:
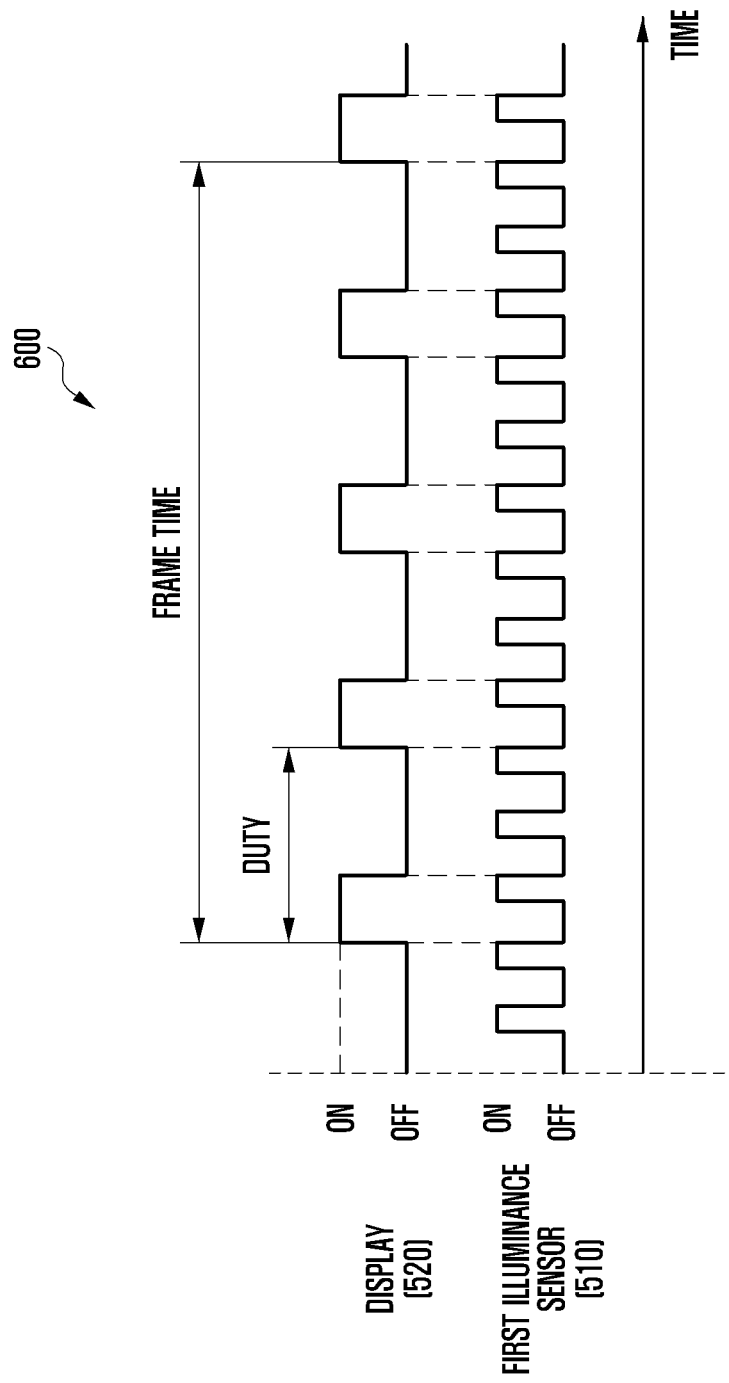
FIG. 6 is a diagram illustrating an illuminance measurement operation based on a turning-on and turning-off period of a display, according to an embodiment.

FIG. 6 is a diagram 600 illustrating an illuminance measurement operation based on turning-on and turning-off period of a display, according to an embodiment. Referring to FIG. 6, the display 520 may repeat turning-on and turning-off several times for a time of displaying one frame. A time (e.g., 16.6 ms) during which all the scan lines (e.g., data lines, gate lines, and power lines) of the display 520 sequentially operate may be the time of displaying one frame (frame time). The display 520 may be repeatedly turned on and turned off several times (e.g., four times) for one frame time. One turning-on and turning-off time may be referred to as a duty, and the ratio of a turning-on time to the total time of one duty (e.g., 4.16 ms) may be referred to as a duty ratio.

The first illuminance sensor 510 may be repeatedly turned on and turned off several times for one frame time. The period for which the first illuminance sensor 510 is turned on and turned off may be shorter than the period for which the display 520 is turned on and turned off.

The processor 560 may configure a period of turning on and turning off the display 520 and a duty ratio thereof. The processor 560 may configure the time of turning on the first illuminance sensor 510 to be less than the time of turning on the display 520 so that the first illuminance sensor 510 may be turned on for the time during which the display 520 is turned off. The processor 560 may calculate an illuminance value using data received from the first illuminance sensor 510 at the time at which the display 520 is turned off. The processor 560 may exclude data that is received from the first illuminance sensor 510 at the time at which the display 520 is turned on from the calculation of the illuminance value.

Figure 7:
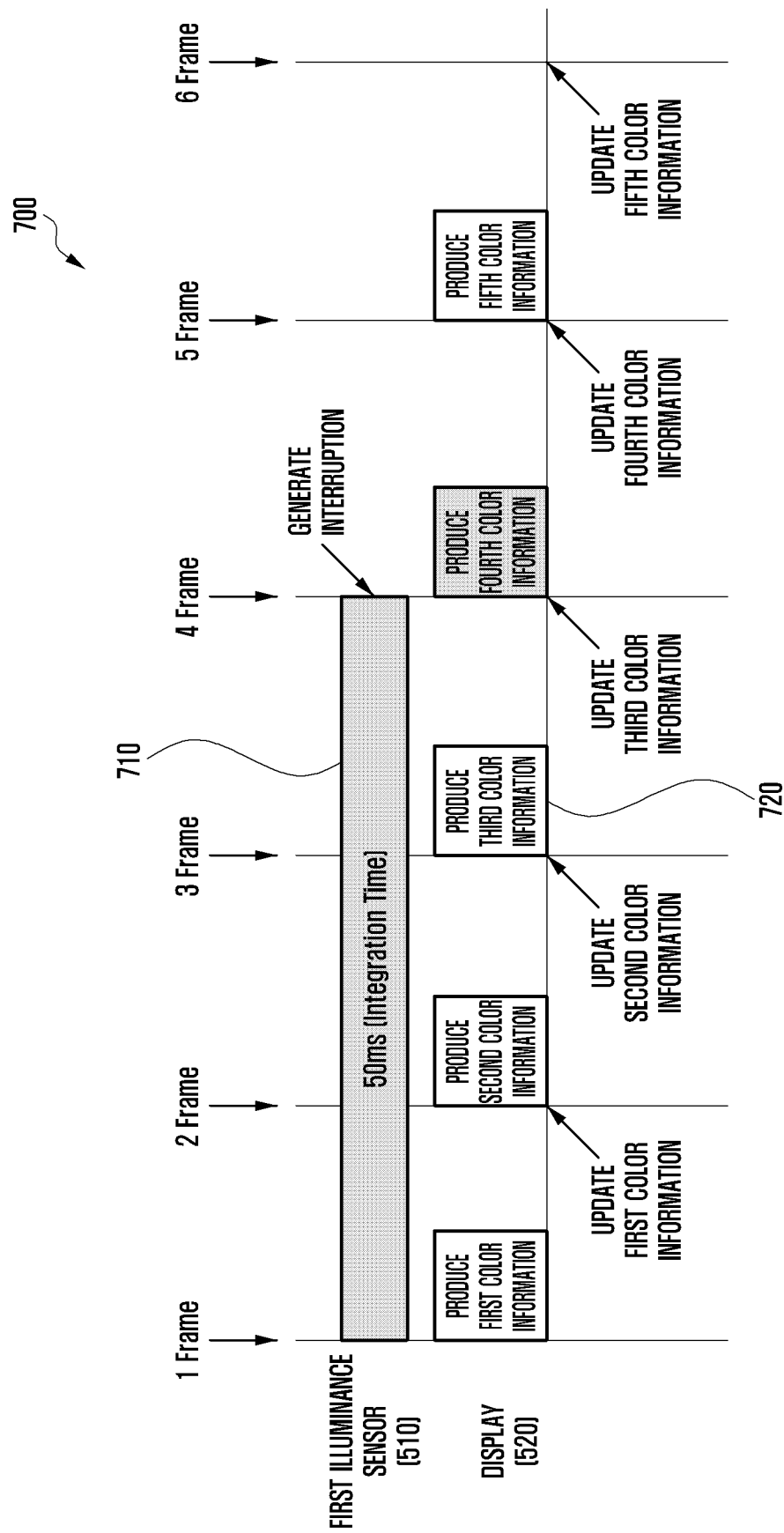
FIG. 7 is a diagram illustrating an illuminance correction operation based on color information of an image, according to an embodiment.

FIG. 7 is a diagram 700 illustrating an illuminance correction operation based on color information of an image, according to an embodiment. Referring to FIG. 7, the first illuminance sensor 510 may receive light during a specified measurement time 710 (e.g., 50 ms), convert the received light into data, and provide the same to the processor 560. The first illuminance sensor 510 may generate an interrupt signal at the time of providing the data.

The display 520 (e.g., the DDI 521) may display image information at every specified frame time (e.g., 16.6 ms) on the active area in units of frames, produce color information corresponding to the frame to be displayed on the active area, and provide the color information to the processor 560 (e.g., the AP 561 or the auxiliary processor 562).

The processor 560 may update color information stored in the memory 550 according to the color information received from the display 520 (e.g., the DDI 521) or the display driver 530. The processor 560 may recognize the generation of the interrupt signal and then identify color information (e.g., third color information 720 about a third frame displayed on the display 520) from the memory 550.

The processor 560 may measure the illuminance around the electronic device 500 using data received from the first illuminance sensor 510. For example, the processor 560 may convert data received from the first illuminance sensor 510 into an illuminance value and remove a difference from the illuminance value using a calibration value stored in the memory 550. The processor 560 may correct the illuminance value obtained as a result of the above measurement, based on the color information identified according to the generation of interruption. For example, the processor 560 may obtain the ratio of R (hereinafter, active area (A_COPR R), the ratio of G (A_COPR G), and the ratio of B (A_COPR B) in the active area from the color information (e.g., third color information 720) identified in the memory 550. The processor 560 may obtain the ratio of R (hereinafter, sensor area (S_COPR R), the ratio of G (S_COPR G), and the ratio of B (S_COPR B) in the sensor area 571 from the color information. The ratio of R in the active area (A_COPR R) may indicate a value representing R of an image to be displayed on the active area, for example, a mean value, a median value, or a mode value. The ratio of R in the sensor area 571 (S_COPR R) may indicate a value representing a portion of the image to be displayed on the sensor area 571, for example, a mean value, a median value, or a mode value. The processor 560 may calculate an illuminance value (e.g., noise component) corresponding to the brightness of the sensor area 571, based on obtained ratio information, and remove the noise component from the illuminance value obtained as a result of the measurement, thereby correcting the illuminance value to converge to the actual illuminance around the electronic device 500.

Figure 8:
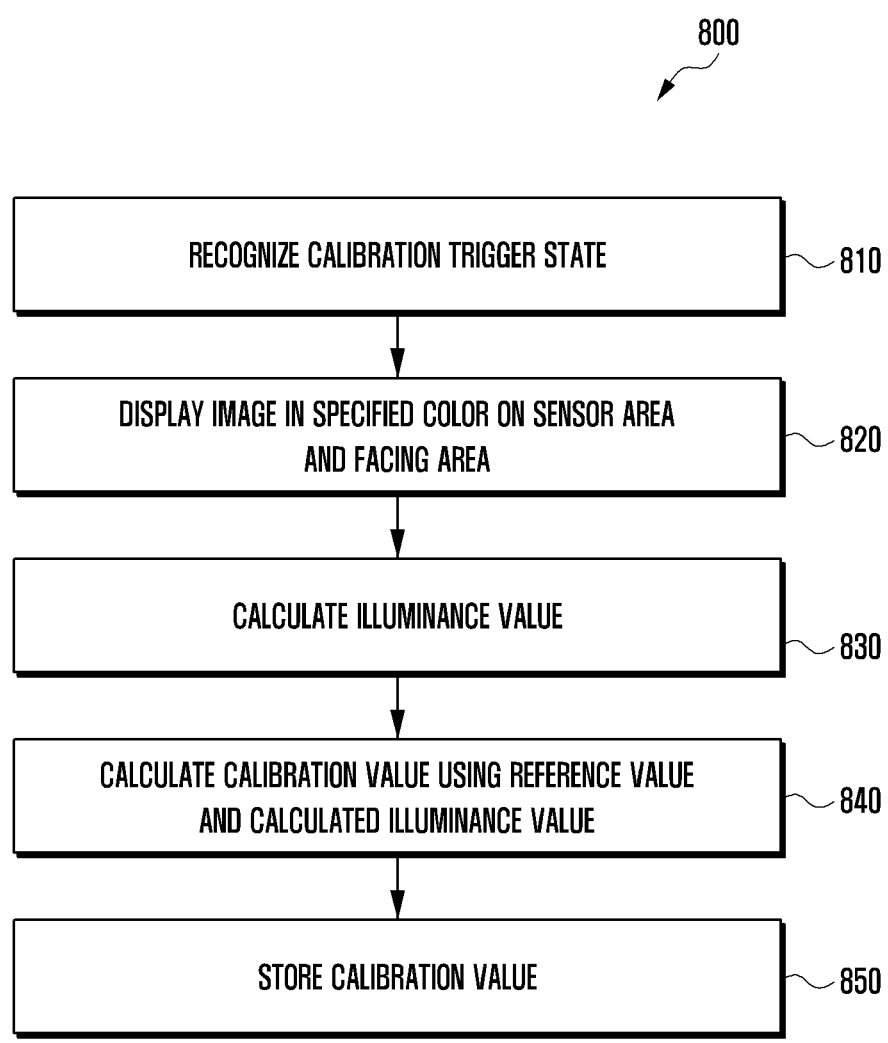
FIG. 8 is a flow diagram illustrating a method for calibrating an illuminance sensor, according to various embodiments.

FIG. 8 is a flow diagram illustrating a method 800 for calibrating a first illuminance sensor 510, according to various embodiments. The operations of method 800 in FIG. 8 may be performed by a processor (e.g., the processor 560 in FIG. 5) and/or a display driver (e.g., the display driver 530 in FIG. 5).

In operation 810, the processor 560 may recognize that the electronic device 500 is in the aforementioned calibration trigger state.

In operation 820, the processor 560 may display a first image on the sensor area 571 and a second image on the facing area 581, based on the recognition. For example, the processor 560 may configure the color of the first image as first color information and configure the color of the second image as second color information with reference to Table 4. While the first image and the second image are being displayed with a color combination of the first color information and the second color information on the sensor area 571 and the facing area 581, respectively, the first illuminance sensor 510 may receive light for a specified measurement time, convert the received light into data, and provide the same to the processor 560.

In operation 830, the processor 560, in response to an interrupt signal generated by the first illuminance sensor 510, may calculate an illuminance value using data received from the first illuminance sensor 510.

In operation 840, the processor 560, using the calculated illuminance value and a reference value (illuminance value) stored in the memory 550, may calculate a calibration value for calibrating the illuminance value calculated using the data received from the first illuminance sensor 510. For example, the processor 560 may identify a reference value corresponding to a color combination of the first color information and the second color information from a lookup table (e.g., Table 4) and calculate, as the calibration value, the ratio of the identified reference value to the calculated illuminance value.

In operation 850, the processor 560 may store the calculated calibration value in the memory 550.

Figure 9A:
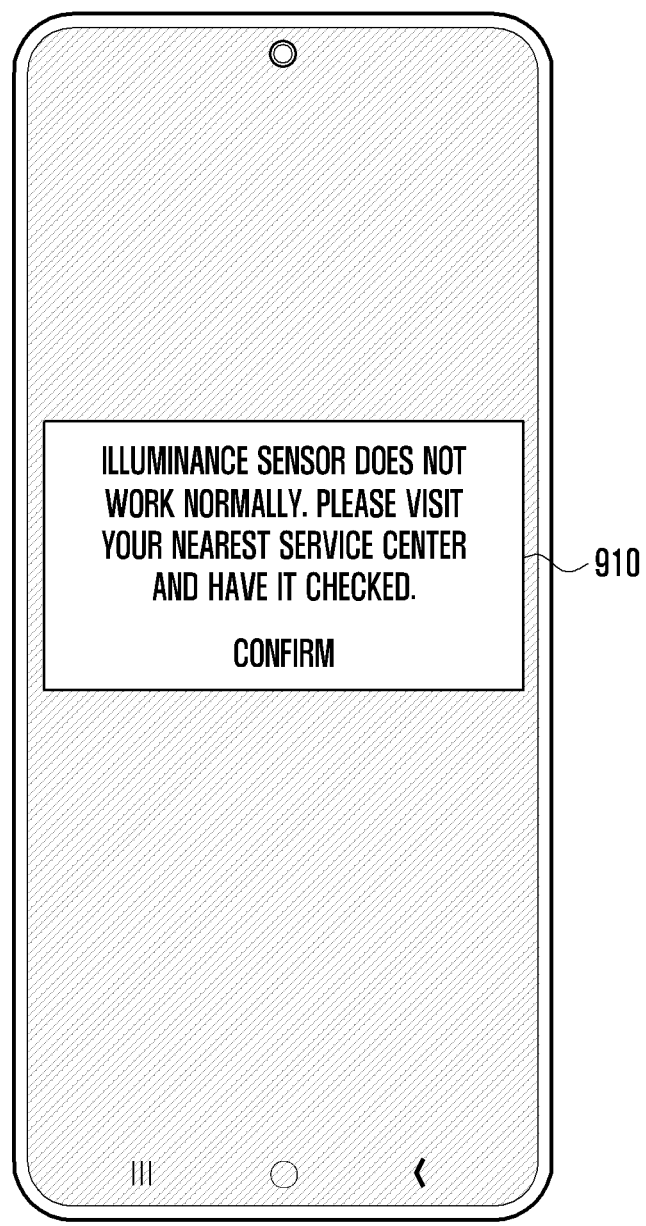
FIGS. 9A and 9B illustrate examples of a screen for explaining an operation for notifying of abnormality of an illuminance sensor, according to an embodiment.
Figure 9B:
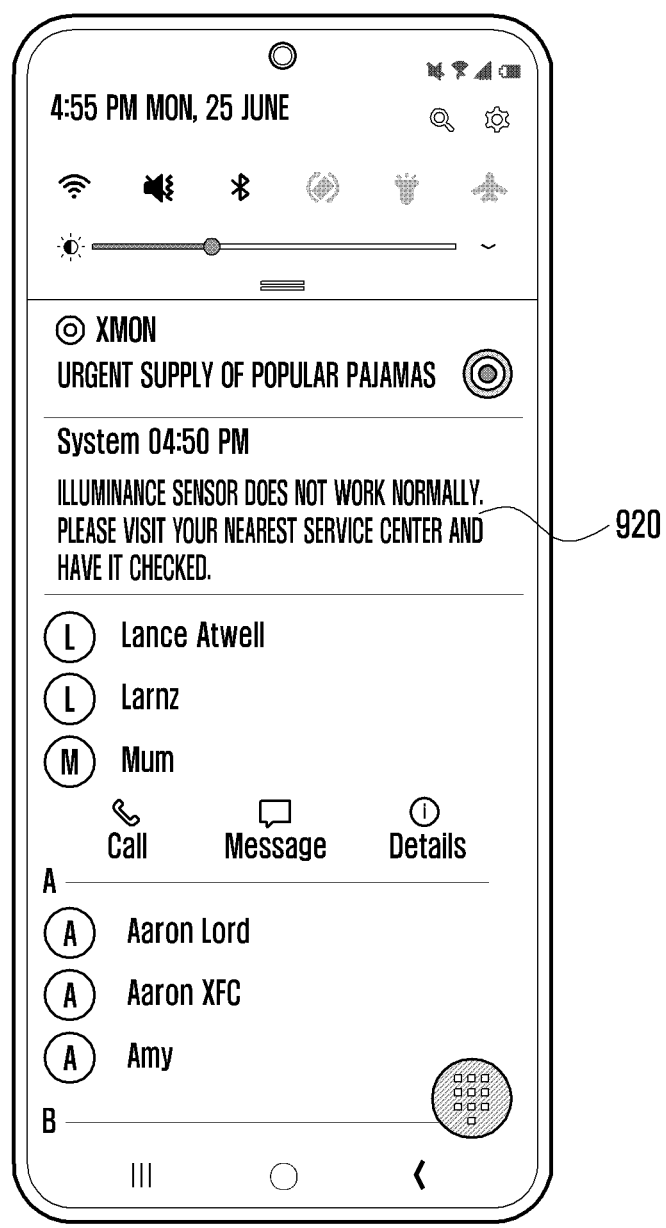

FIGS. 9A and 9B illustrate examples of a screen for explaining an operation for notifying of abnormality of a first illuminance sensor 510, according to an embodiment.

The processor 560 may compare an illuminance value calculated for calibration of the first illuminance sensor 510 with an illuminance range specified for determining whether or not the first illuminance sensor 510 is abnormal and, based on the comparison result, determine whether or not the first illuminance sensor 510 is abnormal.

In an embodiment, the illuminance range may be determined by an illuminance value (hereinafter, a minimum value) of a minimum performance sample (MIN) and an illuminance value (hereinafter, a maximum value) of a maximum performance sample (MAX). If the illuminance value is less than a specified first ratio of the minimum value or if the illuminance value is greater than a specified second ratio of the maximum value, the processor 560 may determine that the first illuminance sensor 510 operates abnormally. For example, if the measured illuminance value is 5 or less in the case where the minimum value is 10 and where the first ratio is 50%, the first illuminance sensor 510 may be determined to be abnormal. If the measured illuminance value is 45 or more in the case where the maximum value is 30 and where the second ratio is 150%, the first illuminance sensor 510 may be determined to be abnormal. That is, the illuminance range is from 5 to 45, and if the measured illuminance value falls outside of this range, the first illuminance sensor 510 may be determined to be abnormal.

In another embodiment, the illuminance range may be determined by an illuminance value (hereinafter, a mean value) of a typical performance sample. If the illuminance value is less than a specified first ratio of the mean value or greater than a specified second ratio of the mean value, the processor 560 may determine that the first illuminance sensor 510 operates abnormally. For example, if the measured illuminance value is 5 or less in the case where the mean value is 20 and where the first ratio is 25%, the first illuminance sensor 510 may be determined to be abnormal. If the measured illuminance value is 45 or more in the case where the mean value is 20 and where the second ratio is 225%, the first illuminance sensor 510 may be determined to be abnormal.

The processor 560 may notify the user of the abnormality of the first illuminance sensor 510 through the display 520. For example, the processor 560 may notify the user that inspection is required through a pop-up window 910. The processor 560 may inform the user of the need for inspection through a notification message 920 in an indicator screen.

A portable electronic device (e.g., the portable electronic device 500) according to various embodiments may include a foldable housing including a first housing and a second housing coupled to the first housing so as to be rotatable relative to the first housing, a display (e.g., the display 520) including a first display area disposed in a space formed inside the first housing and a second display area disposed in a space formed inside the second housing, the second display area facing the first display area when the portable electronic device is in a folded state, a first illuminance sensor (e.g., the first illuminance sensor 510) disposed under the first display area and having a field of view facing the first display area, a state detection sensor (e.g., the state detection sensor 540) configured to detect a state of the foldable housing, a memory (e.g., the memory 550), and a processor (e.g., the processor 560) connected to the display, the first illuminance sensor, the state detection sensor, and the memory. The processor may be configured to store a reference value used for calibration of the illuminance sensor in the memory, recognize that the portable electronic device is in the folded state based on data received from the state detection sensor, display a first image in a sensor area of the first display area positioned above the first illuminance sensor and display a second image in an area of the second display area facing the sensor area responsive to the portable electronic device being in a calibration trigger state comprising the folded state, calculate an illuminance value based on data received from the first illuminance sensor while the first image and the second image are being displayed, calculate a calibration value for calibrating measured illuminance values of the first illuminance sensor, based on a comparison of the calculated illuminance value with the reference value stored in the memory, and store the calibration value in the memory.

The processor may be further configured to calculate a ratio of the predetermined reference value to the calculated illuminance value as the calibration value and calibrate the measured illuminance values by multiplying each measured illuminance value by the ratio.

The memory may store a lookup table including first color information of an image to be displayed in the sensor area, second color information of an image to be displayed in the facing area, and a reference value corresponding to a color combination of the first color information and the second color information. The processor may be further configured to configure a color of the first image according to the first color information, configure a color of the second image according to the second color information, calculate the illuminance value based on data received from the first illuminance sensor while the first image and the second image are being displayed in a color combination of the first color information and the second color information, and identify, as the predetermined reference value, a reference value from the lookup table which corresponds to the color combination of the first color information and the second color information, and calculate a ratio of the predetermined reference value to the calculated illuminance value as the calibration value. The color combination of the first color information and the second color information may be one of: white and black; black and white; or white and white.

The calibration trigger state may further include at least one of: a state in which a current time is a predefined time, and a state in which a battery of the portable electronic device is being charged.

The portable electronic device may further include a second illuminance sensor (e.g., the second illuminance sensor 590) having a field of view facing in a direction opposite to a facing direction of the display, and the calibration trigger state may further include a state in which an illuminance value measured using the second illuminance sensor indicates a bright environment.

The processor may be further configured to notify a user of an abnormality of the first illuminance sensor through the display responsive to the calculated illuminance value falling outside of an illuminance range for determining whether or not the first illuminance sensor has the abnormality. The processor may be further configured to determine the illuminance range based on the reference value. The memory may store a minimum value less than the reference value and a maximum value greater than the reference value, and the processor may be further configured to determine the illuminance range based on the minimum value and the maximum value.

A portable electronic device (e.g., the portable electronic device 500) according to various embodiments may include a foldable housing including a first housing and a second housing coupled to the first housing so as to be rotatable relative to the first housing, a display (e.g., the display 520) including a first display area disposed in a space formed inside the first housing and a second display area disposed in a space formed inside the second housing, the second display area facing the first display area when the portable electronic device is in a folded state, a first illuminance sensor (e.g., the first illuminance sensor 510) disposed under the first display area and having a field of view facing the first display area, a state detection sensor (e.g., the state detection sensor 540) configured to detect a state of the foldable housing, a processor (e.g., the processor 560) connected to the display, the first illuminance sensor, and the state detection sensor, and a memory connected to the processor, wherein the memory may store instructions that, when executed, cause the processor to recognize that the portable electronic device is in the folded state based on data received from the state detection sensor, display a first image in a sensor area of the first display area positioned above the first illuminance sensor and display a second image in an area of the second display area facing the sensor area responsive to the portable electronic device being in a calibration trigger state comprising the folded state, calculate an illuminance value based on data received from the first illuminance sensor while the first image and the second image are being displayed, and calculate and store a calibration value for calibrating measured illuminance values of the first illuminance sensor, based on a comparison of the calculated illuminance value with a predetermined reference value.

The instructions may further cause the processor to calculate a ratio of the predetermined reference value to the calculated illuminance value as the calibration value and calibrate the measured illuminance values by multiplying each measured illuminance value by the ratio.

The memory may store a lookup table including first color information of an image to be displayed in the sensor area, second color information of an image to be displayed in the facing area, and a reference value corresponding to a color combination of the first color information and the second color information. The instructions may further cause the processor to configure a color of the first image according to the first color information, configure a color of the second image according to the second color information, calculate the illuminance value based on data received from the first illuminance sensor while the first image and the second image are being displayed in a color combination of the first color information and the second color information, identify, as the predetermined reference value, a reference value stored in the lookup table which corresponds to the color combination of the first color information and the second color information, and calculate a ratio of the identified reference value to the calculated illuminance value as the calibration value.

The instructions may further cause the processor to notify a user of an abnormality of the first illuminance sensor through the display responsive to the calculated illuminance value falling outside of an illuminance range for determining whether or not the first illuminance sensor has the abnormality. The instructions may further cause the processor to determine the illuminance range based on the reference value. The memory may store a minimum value less than the reference value and a maximum value greater than the reference value, and the instructions may further cause the processor to determine the illuminance range based on the minimum value and the maximum value.

The embodiments of the disclosure disclosed in this specification and drawings are only presented as specific examples to easily explain the technical content according to the embodiments of the disclosure and help understanding of the embodiments of the disclosure, and are not intended to limit the scope of the embodiments of the disclosure. Therefore, the scope of various embodiments of the disclosure should be construed to encompass all changes or modifications derived from the technical spirit of various embodiments of the disclosure, in addition to the embodiments disclosed herein.

What is claimed is:

1. A portable electronic device comprising:
    a foldable housing comprising a first housing and a second housing coupled to the first housing so as to be rotatable relative to the first housing;
    a display comprising a first display area disposed in a space formed inside the first housing and a second display area disposed in a space formed inside the second housing, the second display area facing the first display area when the portable electronic device is in a folded state;
    a first illuminance sensor disposed under the first display area and having a field of view facing the first display area;
    a state detection sensor configured to detect a state of the foldable housing;
    a memory; and
    a processor connected to the display, the first illuminance sensor, the state detection sensor, and the memory,
    wherein the processor is configured to:
        store a reference value used for calibration of the first illuminance sensor in the memory,
        recognize that the portable electronic device is in the folded state based on data received from the state detection sensor,
        display a first image in a sensor area of the first display area positioned above the first illuminance sensor and display a second image in an area of the second display area facing the sensor area responsive to the portable electronic device being in a calibration trigger state comprising the folded state,
        calculate an illuminance value based on data received from the first illuminance sensor while the first image and the second image are being displayed,
        calculate a calibration value for calibrating measured illuminance values of the first illuminance sensor, based on a comparison of the calculated illuminance value with the reference value stored in the memory, and
        store the calibration value in the memory.

2. The portable electronic device of claim 1, wherein the processor is further configured to:
    calculate a ratio of the reference value to the calculated illuminance value as the calibration value; and
    calibrate the measured illuminance values by multiplying each measured illuminance value by the ratio.

3. The portable electronic device of claim 1, wherein the processor is further configured to:
    configure a color of the first image according to first color information stored in the memory, and configure a color of the second image according to second color information stored in the memory;
    calculate the illuminance value based on data received from the first illuminance sensor while the first image and the second image are being displayed in a color combination of the first color information and the second color information;
    identify, as the reference value, a reference value stored in the memory which corresponds to the color combination of the first color information and the second color information; and
    calculate a ratio of the reference value to the calculated illuminance value as the calibration value.

4. The portable electronic device of claim 3, wherein the color combination of the first color information and the second color information comprises one of: white and black; black and white; or white and white.

5. The portable electronic device of claim 1, wherein the calibration trigger state further comprises at least one of: a state in which a current time is a predefined time, and a state in which a battery of the portable electronic device is being charged.

6. The portable electronic device of claim 1, further comprising a second illuminance sensor having a field of view facing in a direction opposite to a facing direction of the display,
wherein the calibration trigger state further comprises a state in which an illuminance value measured using the second illuminance sensor indicates a bright environment.

7. The portable electronic device of claim 1, wherein the processor is further configured to notify a user of an abnormality of the first illuminance sensor through the display responsive to the calculated illuminance value falling outside of an illuminance range for determining whether or not the first illuminance sensor has the abnormality.

8. The portable electronic device of claim 7, wherein the processor is further configured to determine the illuminance range based on the reference value.

9. The portable electronic device of claim 7, wherein the processor is further configured to:
store a minimum value less than the reference value and a maximum value greater than the reference value in the memory; and
determine the illuminance range based on the minimum value and the maximum value.

10. A portable electronic device comprising:
a foldable housing comprising a first housing and a second housing coupled to the first housing so as to be rotatable relative to the first housing;
a display comprising a first display area disposed in a space formed inside the first housing and a second display area disposed in a space formed inside the second housing, the second display area facing the first display area when the portable electronic device is in a folded state;
a first illuminance sensor disposed under the first display area and having a field of view facing the first display area;
a state detection sensor configured to detect a state of the foldable housing;
a processor connected to the display, the first illuminance sensor, and the state detection sensor; and
a memory connected to the processor,
wherein the memory stores instructions that, when executed, cause the processor to:
recognize that the portable electronic device is in the folded state based on data received from the state detection sensor,
display a first image in a sensor area of the first display area positioned above the first illuminance sensor and display a second image in an area of the second display area facing the sensor area responsive to the portable electronic device being in a calibration trigger state comprising the folded state,
calculate an illuminance value based on data received from the first illuminance sensor while the first image and the second image are being displayed, and
calculate and store a calibration value for calibrating measured illuminance values of the first illuminance sensor, based on a comparison of the calculated illuminance value with a predetermined reference value.

11. The portable electronic device of claim 10, wherein the instructions further cause the processor to:
calculate a ratio of the predetermined reference value to the calculated illuminance value as the calibration value; and
calibrate the measured illuminance values by multiplying each measured illuminance value by the ratio.

12. The portable electronic device of claim 10, wherein the instructions further cause the processor to:
configure a color of the first image according to first color information stored in the memory, and configure a color of the second image according to second color information stored in the memory;
calculate the illuminance value based on data received from the first illuminance sensor while the first image and the second image are being displayed in a color combination of the first color information and the second color information;
identify, as the predetermined reference value, a reference value stored in the memory which corresponds to the color combination of the first color information and the second color information; and
calculate a ratio of the identified reference value to the calculated illuminance value as the calibration value.

13. The portable electronic device of claim 10, wherein the calibration trigger state further comprises at least one of: a state in which a current time is a predefined time, and a state in which a battery of the portable electronic device is being charged.

14. The portable electronic device of claim 10, further comprising a second illuminance sensor having a field of view facing in a direction opposite to a facing direction of the display,
wherein the calibration trigger state further comprises a state in which an illuminance value measured using the second illuminance sensor indicates a bright environment.

15. The portable electronic device of claim 10, wherein the instructions further cause the processor to notify a user of an abnormality of the first illuminance sensor through the display responsive to the calculated illuminance value falling outside of an illuminance range for determining whether or not the first illuminance sensor has the abnormality.

* * * * *